US011908894B2

(12) United States Patent
Huang et al.

(10) Patent No.: US 11,908,894 B2
(45) Date of Patent: Feb. 20, 2024

(54) DEFORMABLE ELECTRONIC DEVICE AND METHOD OF MAKING A DEFORMABLE ELECTRONIC DEVICE

(71) Applicant: THE BOARD OF TRUSTEES OF THE UNIVERSITY OF ILLINOIS, Urbana, IL (US)

(72) Inventors: Pinshane Huang, Urbana, IL (US); Arend van der Zande, Urbana, IL (US); Elif Ertekin, Urbana, IL (US); Edmund Han, Champaign, IL (US); Jaehyung Yu, Chicago, IL (US); Mohammad Abir Hossain, Urbana, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 137 days.

(21) Appl. No.: 17/226,331

(22) Filed: Apr. 9, 2021

(65) Prior Publication Data

US 2021/0320173 A1 Oct. 14, 2021

Related U.S. Application Data

(60) Provisional application No. 63/008,463, filed on Apr. 10, 2020.

(51) Int. Cl.
*H01L 29/06* (2006.01)
*H01L 29/76* (2006.01)
(Continued)

(52) U.S. Cl.
CPC ...... *H01L 29/0684* (2013.01); *H01L 29/1606* (2013.01); *H01L 29/22* (2013.01); *H01L 29/24* (2013.01); *H01L 29/7606* (2013.01)

(58) Field of Classification Search
CPC ............. H01L 21/02609; H01L 29/045; H01L 31/036
See application file for complete search history.

(56) References Cited

U.S. PATENT DOCUMENTS 9,808,782 B2  11/2017  Li et al.
9,908,285 B2   3/2018  Nam et al.
(Continued)

FOREIGN PATENT DOCUMENTS

CN    109595989 A  *  4/2019  ............... F41H 1/02

OTHER PUBLICATIONS

Chen et al., "Wrinkling of two-dimensional materials: methods, properties and applications," Nanoscale Horizons, 4 (2019), pp. 291-230. (Year: 2019).*
(Continued)

*Primary Examiner* — Raj R Gupta
(74) *Attorney, Agent, or Firm* — Crowell & Moring LLP

(57) ABSTRACT

A method of making a deformable electronic device comprises forming a multilayer device structure comprising functional layers on a flexible substrate. At least one, some or all of the functional layers comprises a stack of 2D monolayers, and a number or proportion of misaligned interfaces within each stack of 2D monolayers is controlled to obtain a predetermined bending stiffness. Each of the misaligned interfaces comprises a twist angle and/or lattice mismatch between adjacent 2D monolayers. The functional layers may include electronically active layers and other layers having a dielectric, insulating, and/or protective function.

15 Claims, 16 Drawing Sheets

(51) Int. Cl.
   *H01L 29/24*   (2006.01)
   *H01L 29/22*   (2006.01)
   *H01L 29/16*   (2006.01)

(56) References Cited

U.S. PATENT DOCUMENTS

| | | | |
|---|---|---|---|
| 10,692,977 | B2 | 6/2020 | Withers et al. |
| 2016/0043270 | A1* | 2/2016 | Li .................. H01L 31/0264 257/94 |

OTHER PUBLICATIONS

Akinwande et al., "Two-dimensional Flexible Nanoelectronics," Nature Communications, 5:5678 (2014), pp. 1-12.
Akinwande et al., "A review on mechanics and mechanical properties of 2D materials—Graphene and beyond," Extreme Mechanics Letters, 13 (2017), pp. 42-47.
Aslan et al., "Strain Tuning of Excitons in Monolayer $WSe_2$," Physical Review B, 98, (2018) pp. 115308-1-115308-6.
Brennan et al., "Interface Adhesion between 2D Materials and Elastomers Measured by Buckle Delaminations," Advanced Materials Interfaces, (2015), pp. 1500176-1-150076-7.
Bunch et al., "Electromechanical Resonators from Graphene Sheets," Science, 315, (2007), pp. 409-493.
Castellanos-Gomez et al., "Local Strain Engineering in Atomically Thin $MoS_2$", NanoLetters, 13 (2013), pp. 5361-5366.
Chen et al., "Bending Stiffness and Interlayer Shear Modulus of Few-Layer Graphene," Applied Physics Letters, 106, 101907 (2015) pp. 1-6.
Chen et al., "Wrinkling of two-dimensional materials: methods, properties and applications," Nanoscale Horizons, 4 (2019), pp. 291-230.
Chen et al., "Chemical Vapor Deposition of Large-Sized Hexagonal $WSe_2$ Crystals on Dielectric Substrates," Advanced Materials, 27 (2015), pp. 6722-6727.
Conley et al., "Bandgap Engineering of Strained Monolayer and Bilayer $MoS_2$," NanoLetters, 13 (2013), pp. 3626-3630.
Dean et al., "Boron nitride substrates for high-quality graphene electronics," Nature Nanotechnology, 5 (2010), pp. 722-726.
Deng et al., "Wrinkled, Rippled and Crumpled Graphene: an Overview of Formation Mechanism, Electronic Properties, and Applications," Materials Today, 19, 4 (2016), pp. 197-212.
Dodabalapur et al., "Organic and Polymer Transistors for Electonics," Materials Today, 9, 4 (2006), pp. 24-30.
Furchi et al., "Mechanisms of Photoconductivity in Atomically Thin $MoS_2$," NanoLetters, 14 (2014), pp. 6165-6170.
Gant et al., "A Strain Tunable Single-Layer $MoS_2$ photodetector," Materials Today, 27 (2019), pp. 8-13.
Geim et al., "Van der Waals Heterostructures," Nature, 499 (2013), pp. 419-425.
Georgiou et al., "Vertical Field-Effect Transistor Based on Graphene-$WS_2$ for Flexible and Transparent Electronics," Nature Nanotechnology, 8 (2013), pp. 100-103.
Hamer et al., "Gate-Defined Quantum Confinement in InSe-Based van der Waals Heterostructures," Nano Letters, 18 (2018), pp. 3950-3955.
Han et al., "Ultra Slip-Mediated Bending in Fe-Layer Graphene," Nature Materials, 10 (2020), pp. 305-309.
He et al., "Experimental Demonstration of Continuous Electonic Structure Turning via Strain in Atomically Thin $MoS_2$," NanoLetters, 13 (2013), pp. 2931-2936.
Hossain et al., "Strain Engineering Photonic Properties in Monolayer Semiconductors Through Mechanically-reconfigurable wrinkling," Physical Chemistry of Semiconductor Materials and Interfaces IX, ed. by C. Nelson et al., Proceedings of the SPIE, 11464 (2020), pp. 1146404-1-1146404-7.
Huang et al.., "Large-area synthesis of monolayer $WSe_2$ on a $SiO_2$/Si substrate and its device applications," Nanoscale, 7 (2015), pp. 4193-4198.

Hwang et al., "Ultrasensitive Detection of Nucleic Acids Using Deformed Graphene Channel Field Effect Biosensors," Nature Communications, 11:1543 (2015), pp. 1-11.
Kang et al., "Crumpled Graphene Photodetector with Enhanced, Strain-Tunable, and Wavelength-Selective Photoresponsivity," Advanced Materials, 28 (2016), pp. 4638-4345.
Khestanova et al., "Universal shape and pressure inside bubbles appearing in van der Waals heterostructures," Nature Communications, 7:12587 (2016), pp. 1-10.
Kim et al. "Mechanical properties of two-dimensional materials and their applications," Journal of Physics, 52:083001 (2019) pp. 1-32.
Kim et al., "Nano-electromechanical Drumhead Resonators from Two Dimensional Material Bimorphs," Nano Letters, 18 (2018), pp. 6686-6695.
Kim et al., "Multiply Folded Graphene," Phys. Rev. B, 83 (2011), pp. 245433-1 to 245433-8.
Kumar et al., "Limits of Coherency and Strain Transfer in Flexible 2D van der Waals Heterostructures: Formation of Strain Solitons and Interlayer Debonding," Scientific Reports, 6:21516 (2016), pp. 1-8.
Lee et al., "Flexible and Transparent $MoS_2$ Field-Effect Transistors on Hexagonal Boron Nitride-Graphene Heterostructures," ACSNano, 7, 9 (2013) pp. 7931-7936.
Lim et al., "Assembly of Foldable 3D Microstructures Using Graphene Hinges," Advanced Materials, 32, 2001303 (2020) pp. 1-8.
Liu et al., "A Molecular Dynamics Study of the Mechanical Properties of Twisted Bilayer Graphene," Micromachines, 9, 440 (2018), pp. 1-11.
Liu et al., "Van der Waals Heterostructures and Devices," Nature Reviews, 1 (2016) pp. 1-17.
Liu et al., "Elastic Properties of Chemical-Vapor-Deposited Monolayer $MoS_2$, $WS_2$, and Their Bilayer Heterostructures," Nano Letters, 14 (2014) pp. 5097-5103.
Lloyd et al., "Band Gap Engineering with Ultralarge Biaxial Strains in Suspended Monolayer $MoS_2$," Nano Letters, 16 (2016) 5836-5841 pp.
Lopez-Sanchez et al., "Ultrasensitive photodetectors based on monolayer $MoS_2$," Nature Nanotechnology, 8 (2013) pp. 497-501.
Nathan et al., "Flexible Electronics: The Next Ubiquitous Platform," Proceedings of the IEEE, 100 (2012) pp. 1486-1517.
Perea-López et al., "CVD-grown Monolayered $MoS_2$ as an Effective Photosensor Operating at Low-Voltage," 2D Materials, 1, 011004 (2014) pp. 1-12.
Petrone et al., "Graphene Field-Effect Transistors with Gigahertz-Frequency Power Gain on Flexible Substrates," Nano Letters, 13 (2013) pp. 121-125.
Rhee et al., "Soft Skin Layers Enable Area-Specific, Multiscale Graphene Wrinkles with Switchable Orientations," ACS Nano, 14 (2020), pp. 166-174.
Rogers et al., "Materials and Mechanics for Stretchable Electronics," Science, 327, (2010), pp. 1603-1607.
Sanchez et al., "Mechanics of Spontaneously Formed Nanoblisters Trapped by Transferred 2D Crystals," PNAS, 115, 31 (2018) pp. 7884-7809.
Scharfenberg et al., "Probing the Mechanical Properties of Graphene Using a Corrugated Elastic Substrate," Applied Physics Letters, 98, 091908 (2011), pp. 1-3.
Shen et al., "Interlayer Shear Effect on Multilayer Graphene Subjected to Bending," Applied Physics Letters, 100 (2012), pp. 101909-1 to 101909-3.
Tan et al., "Ultrathin 2D Photodetectors Utilizing Chemical Vapor Deposition Grown $WS_2$ With Graphene Electrodes," ACS Nano, 10 (2016), pp. 7866-7813.
Tanner et al. "Visual detection of isothermal nucleic acid amplification using pH-sensitive dyes," BioTechniques, 58, 2 (2015), pp. 59-68.
Thomas et al., "Controlled Crumpling of Graphene Oxide Films for Tunable Optical Transmittance," Advanced Materials, 27 (2015) pp. 3256-3265.
Van Der Zande et al., "Large-Scale Arrays of Single-Layer Graphene Resonators," Nano Letters, 10 (2010) pp. 4869-4873.

(56) References Cited

OTHER PUBLICATIONS

Wang et al., "High-Performance WSe$_2$ Phototransistors with 2D/2D Ohmic Contacts," Nano Letters, 18 (2018) pp. 2766-2771.

Wang et al., "Super-Elastic Graphene Ripples for Flexible Strain Sensors," ACS Nano, 5, 5 (2011) pp. 3645-3650.

Wu et al., "Ultrahigh Photoresponsivity MoS$_2$ photodetector with tunable photocurrent generation mechanism," Nanotechnology, 29, 485204 (2018), pp. 1-8.

Yang et al., "Tuning the Optical, Magnetic, and Electrical Properties of ReSe$_2$ by Nanoscale Strain Engineering," Nano Letters, 115 (2015), pp. 1660-1666.

Yi et al., "A Study of Lateral Schottky Contacts in WSe$_2$ and MoS$_2$ Field Effect Transistors Using Scanning Photocurrent Microscopy," Nanoscale, 7 (2015) pp. 15711-15718.

Yin et al., "Single-Layer MoS$_2$ Phototransistors," ACS Nano, 6, 1 (2012) pp. 74-80.

Yu et al. "Material-Dependent Evolution of Mechanical Folding Instabilities in Two-Dimensional Atomic Membranes," ACS Applied Material and Interfaces, 12 (2020), pp. 10801-10808.

Zang et al., "Stretchable and High-Performance Supercapacitors with Crumpled Graphene Papers," Scientific Reports, 4:6492 (2014), pp. 1-7.

Zang et al., "Multifunctionality and Control of the Crumpling and Unfolding of Large-Area Graphene," Nature Materials, 12 (2013), pp. 321-325.

Zhang et al., "Electrotunable Artificial Molecules Based on van der Waals Heterostructures," Science Advances, 3:e1701699 (2017), pp. 1-6.

Zhang et al "High-Gain Phototransistors Based on a CVD MoS$_2$ Monolayer," Advanced Materials, 25 (2013) pp. 3456-3461.

Zhang et al., "Role of Metal Contacts in High-Performance Phototransistors Based on WSe$_2$ Monolayers," ACS Nano, 8, 8, (2014) pp. 8653-8661.

Zhang et al., "Quasi-analytical Solution for the Stable System of the Multi-Layer Folded Graphene Wrinkles," Journal of Applied Physics, 114 (2013) pp. 063511-1 to 063511-8.

Zhang et al., "Determining Graphene Adhesion via Substrate-Regulated Morphology of Graphene," Journal of Applied Physics, 110 (2011) pp. 083521-1 to 083526-5.

Zheng et al., "Atomic Structure and Mechanical Properties of Twisted Bilayer Graphene," Journal of Composites Science, 3, 2 (2019), pp. 1-8.

Zheng et al., "Flexible, Transparent and Ultra-Broadband Photodetector based on Large-Area WSe$_2$ Film for Wearable Devices," Nanotechnology, 27, 225501 (2016), pp. 1-11.

Zhu et al., "Structure and Electronic Transport in Graphene Wrinkles," Nano Letters, 12 (2012) pp. 3431-3436.

Zhu et al., "Delamination-Based Measurement and Prediction of the Adhesion Energy of Thin Film/Substrate Interfaces," Journal of Engineering Materials and Technology, 136 (2017) pp. 021021-1 to 021021-4.

Zhu et al., "Thin Film Transistors Based on Two Dimensional Graphene and Graphene/Semiconductor Heterojunctions," RSC Advances, 7, (2017), pp. 17387-17397.

Zultak et al., "Ultra-thin Van Der Waals Crystals as Semiconductor Quantum Wells," Nature Communications, 11:125 (2020) pp. 1-6.

\* cited by examiner

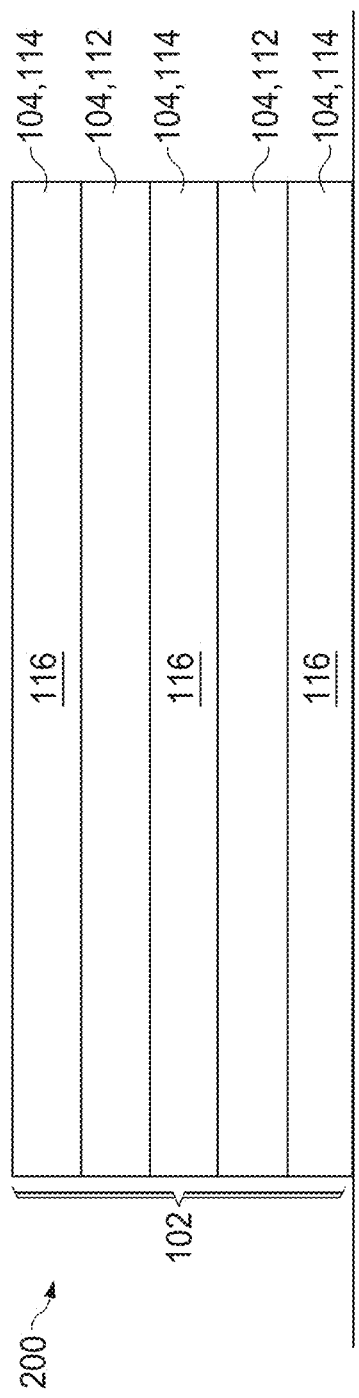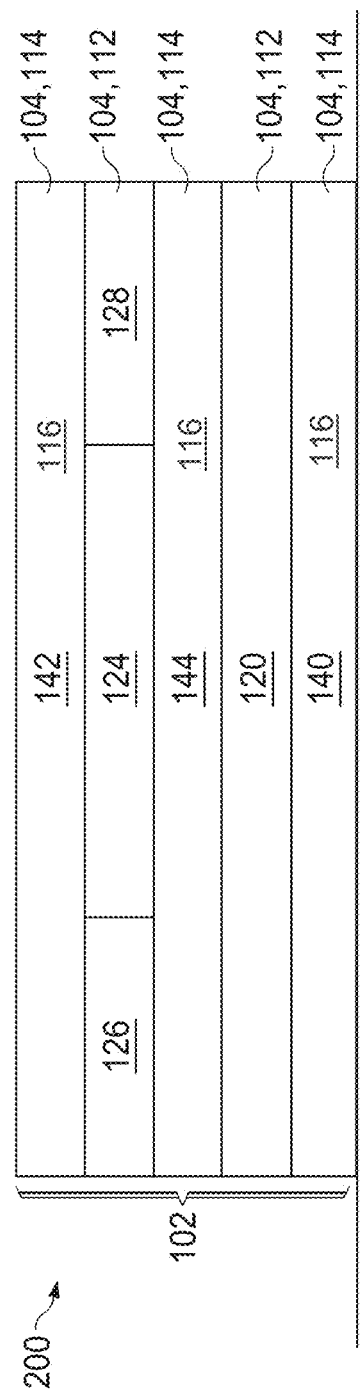

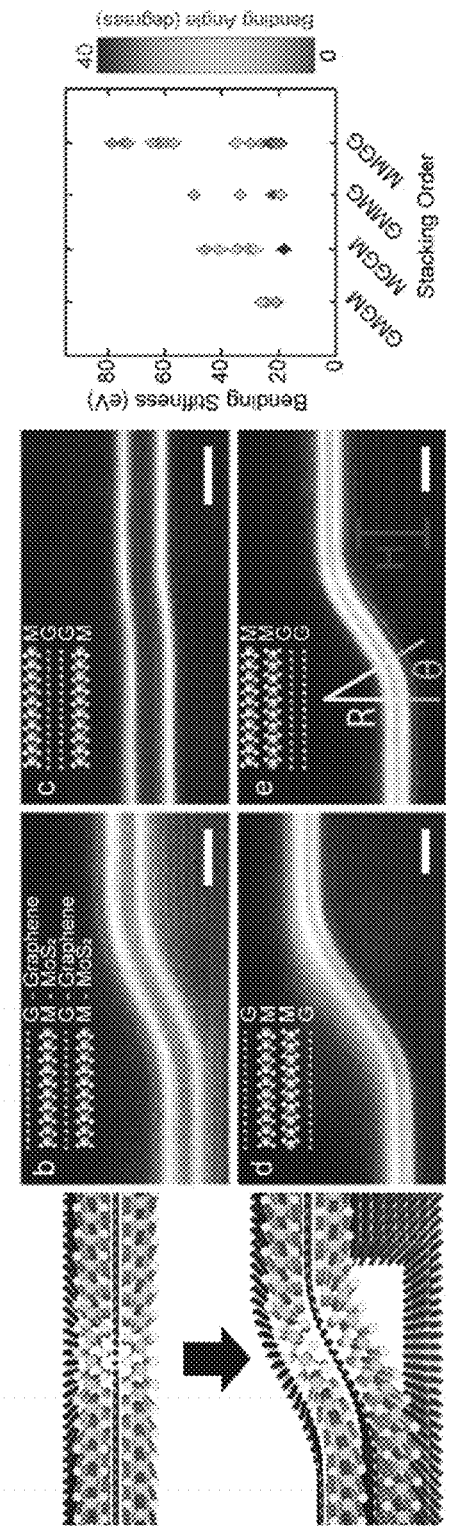

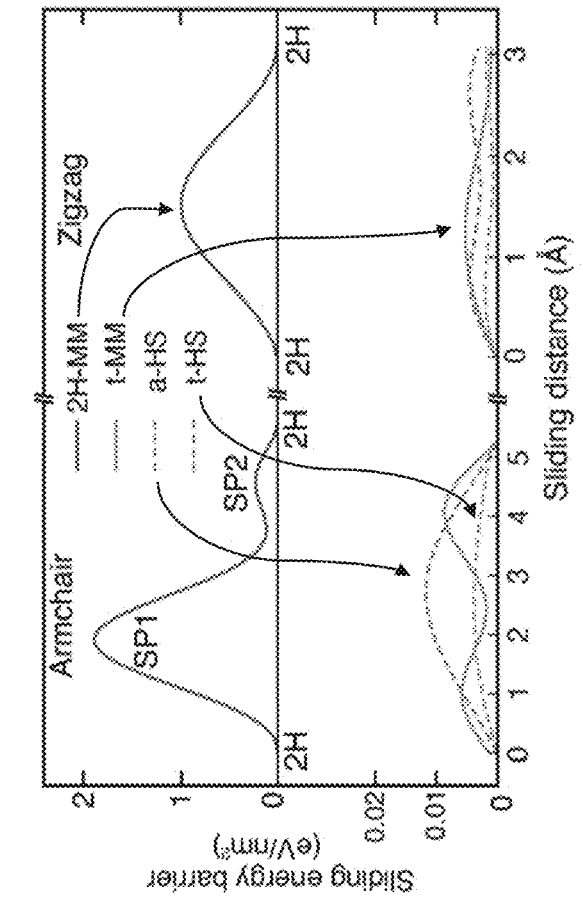
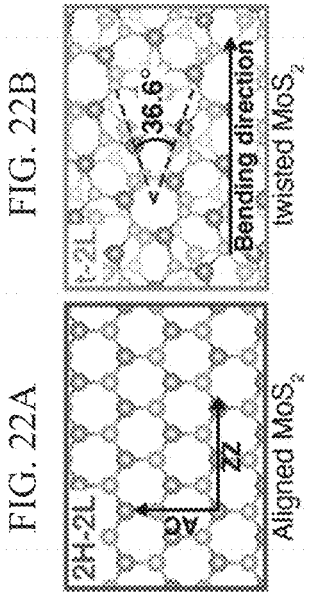
FIG. 22A
FIG. 22B
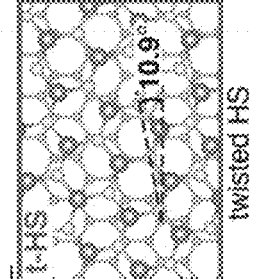
FIG. 22C
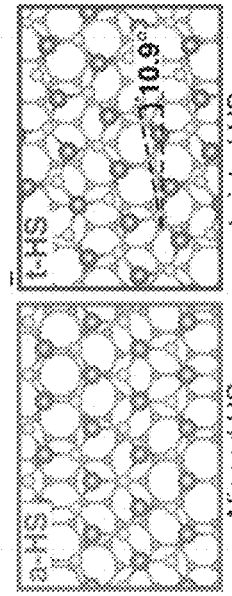
FIG. 22D
FIG. 22E

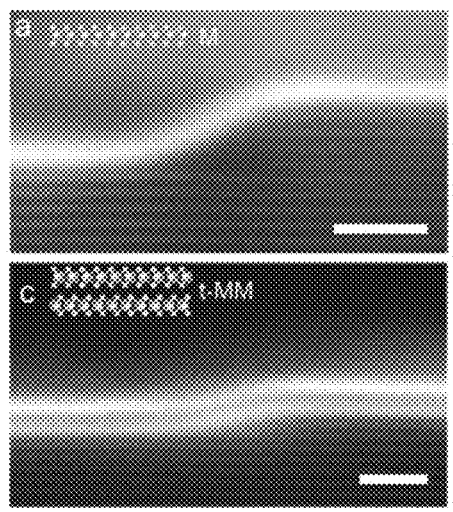
FIG. 23A
FIG. 23B
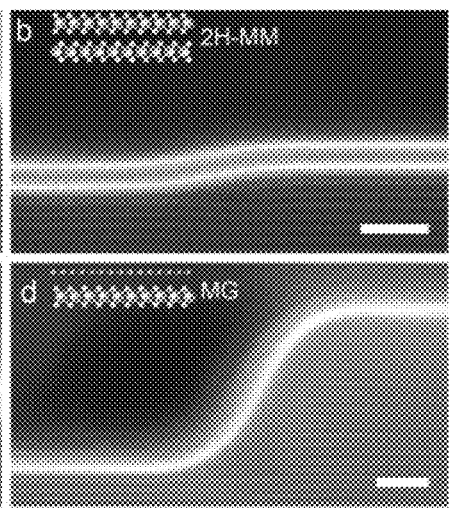
FIG. 23C
FIG. 23D
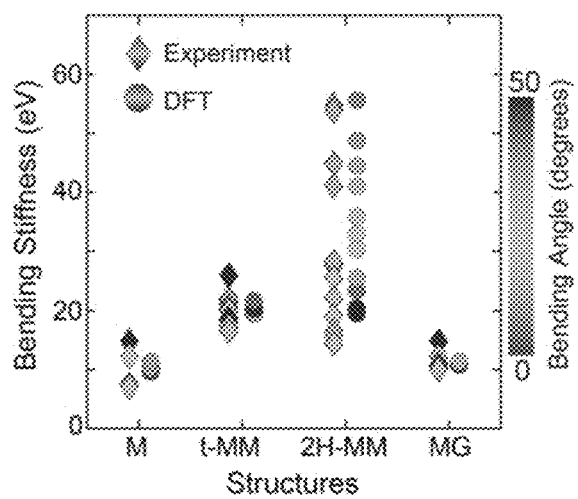
FIG. 23E

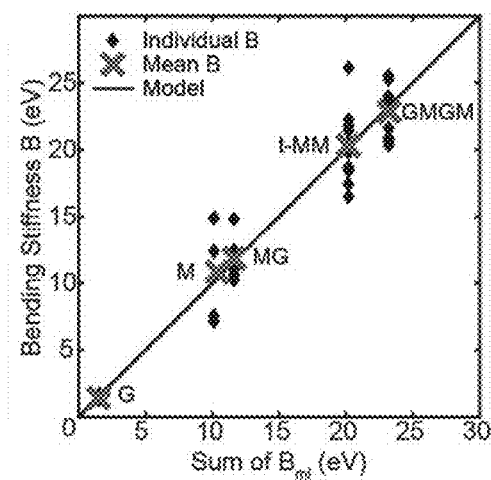
FIG. 24C
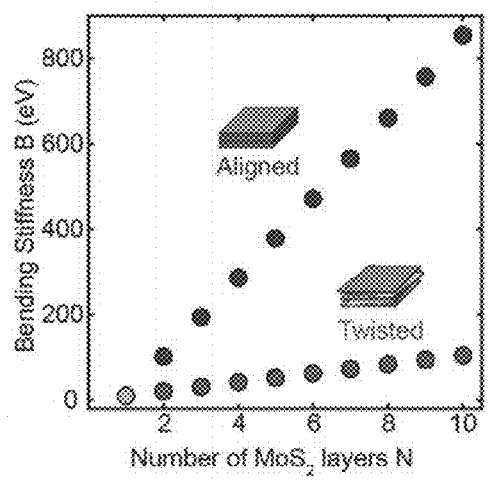 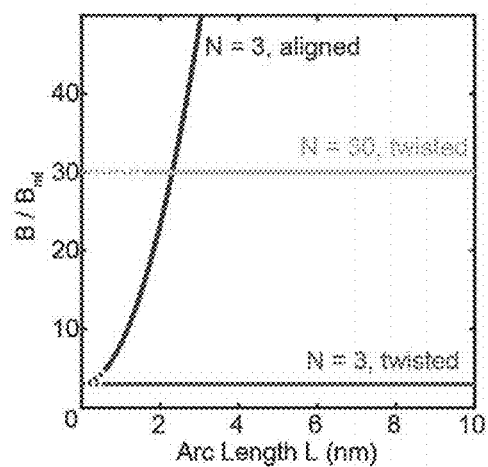
FIG. 24D  FIG. 24E

DEFORMABLE ELECTRONIC DEVICE AND METHOD OF MAKING A DEFORMABLE ELECTRONIC DEVICE

RELATED APPLICATION

The present patent document claims the benefit of priority under 35 U.S.C. 119(e) to U.S. Provisional Patent Application No. 63/008,463, which was filed on Apr. 10, 2020, and is hereby incorporated by reference in its entirety.

FEDERALLY SPONSORED RESEARCH OR DEVELOPMENT

This invention was made with government support under grant number DMR-1720633 awarded by the National Science Foundation. The government has certain rights in the invention.

TECHNICAL FIELD

The present disclosure is related generally to two-dimensional (2D) materials and more particularly to three-dimensionally deformable electronic devices constructed from 2D materials.

BACKGROUND

Increasing demand for wearable technologies requires materials capable of undergoing large mechanical deformations yet maintaining electronic properties rivaling the conventional materials used in rigid electronics. Great progress has been made in demonstrating functional deformable devices from patterned delamination of stiff thin films or from soft organic molecules. However, in most materials, there is a fundamental tradeoff between mechanical pliability and electronic mobility, limiting both device size and performance. Conventional semiconductors tend to become unstable in films <10 nm thick, while soft materials and organic electronics are pliable but suffer from low mobility. Atomic membranes from 2D materials are naturally stable down to a monolayer and thus may offer a notable exception to this tradeoff. 2D materials exhibit a host of unusual properties that arise from their anisotropic atomic structure and bonding. For example, the three-dimensional (3D) Young's modulus of few-layer graphene (FLG) is 1000 GPa (1 TPa), three orders of magnitude larger than its 4.6 GPa shear modulus. 2D materials are the strongest materials known yet may be as pliable as a cell membrane (bending modulus of about 1-10 eV). Simultaneously, they exhibit a range of electronic properties and may behave as metals, semiconductors, and insulators.

BRIEF SUMMARY

Described in this disclosure are deformable electronic devices that exploit intentional and controlled interfacial misalignment between 2D monolayers to tune or reduce bending stiffness. Also described are methods of making such devices.

According to a first embodiment, a deformable electronic device comprises a multilayer device structure including functional layers on a flexible polymeric substrate, where each of the functional layers comprises one or more 2D monolayers. The multilayer device structure further includes, between adjacent functional layers, a misaligned interface comprising a twist angle.

According to second embodiment, a deformable electronic device comprises a multilayer device structure including functional layers on a flexible polymeric substrate, where the functional layers include electronically active layers and other layers which may have a dielectric, insulating and/or protective function. At least one of the other layers comprises a stack of 2D monolayers, and each stack of 2D monolayers includes at least one misaligned interface within the stack. Each misaligned interface comprises a twist angle and/or lattice mismatch between adjacent 2D monolayers.

According to a first aspect, a method of making a deformable electronic device comprises forming a multilayer device structure including functional layers on a flexible substrate. At least one of the functional layers comprises a stack of 2D monolayers, and a number or proportion of misaligned interfaces within each stack of 2D monolayers is controlled to obtain a predetermined bending stiffness. Each misaligned interface may comprise a twist angle and/or lattice mismatch between adjacent 2D monolayers. The functional layers may include electronically active layers and other layers having a dielectric, insulating, and/or protective function.

According to a second aspect, a method of making a deformable electronic device comprises forming a multilayer device structure including functional layers on a flexible polymeric substrate, where each of the functional layers comprises one or more 2D monolayers. The multilayer device is formed to include a twist angle between some or all of the adjacent functional layers.

According to a third aspect, a method of making a deformable electronic device may comprise forming a multilayer device structure comprising functional layers on a flexible substrate, where the functional layers include electronically active layers and other layers which may have a dielectric, insulating, and/or protective function. At least one, some or all of the other layers comprises a stack of 2D monolayers, and each of the stacks of 2D monolayers is formed to include at least one misaligned interface. Each misaligned interface may comprise a twist angle and/or lattice mismatch between adjacent 2D monolayers. The method may further comprise controlling a number or proportion of misaligned interfaces within the stacks of 2D monolayers to obtain a predetermined bending stiffness.

BRIEF DESCRIPTION OF THE DRAWINGS

FIG. 15 shows a cross-sectional schematic of the deformable electronic device according to a second embodiment, where each of the other layers having a dielectric, insulating and/or protective function comprises a stack of 2D monolayers that includes at least one misaligned interface (a twist angle and/or lattice mismatch due to heterostructuring), thereby promoting a reduced bending stiffness.

FIG. 16 shows a cross-sectional schematic of an exemplary field effect transistor including first and second encapsulation layers and a dielectric layer having the interfacial misalignment of FIG. 15.

FIG. 21A-21E shows bending of four-layer 2D heterostructures composed of two graphene (G) and two $MoS_2$ (M) layers; in particular, FIG. 21A shows a schematic of a heterostructure draped over an atomically sharp step of h-BN, and FIGS. 21B-21E show cross-sectional ADF-STEM images of four different 2D heterostructures (GMGM, MGGM, GMMG, and MMGG) with identical composition but different stacking orders, where the bending profile of each heterostructure is measured via the radius of curvature (R), bending angle (θ), and step height (H). Scale bars are 2 nm.

FIG. 21F shows a plot of bending stiffness for each heterostructure, where lower bending stiffnesses correspond to data points having higher bending angles. MGGM, GMMG, and MMGG show a strong bending angle dependence in bending stiffness. In contrast, GMGM shows no bending angle dependence. At low bending angles, the measured bending stiffness is higher for structures with more aligned interfaces (those containing MM or GG). At high bending angles, the bending stiffnesses of all four structures converge to approximately 20-25 eV.

FIGS. 22A-22D show results of DFT calculations for the interlayer sliding energy barrier of aligned, twisted, and heterointerfaces in 2D materials, in particular, a top view of DFT simulated atomic structure of 2H-stacked bilayer $MoS_2$ (2H-MM), twisted bilayer $MoS_2$ (t-MM), non-twisted graphene-$MoS_2$ (a-GM), and twisted graphene-$MoS_2$ (t-GM), respectively. The dotted lines in FIGS. 22B and 22D indicate the twist angle φ between the top and bottom monolayers.

FIG. 22E shows a plot of DFT simulated sliding energy barriers of bilayer $MoS_2$ (solid line) and graphene-$MoS_2$ (dashed line) versus the sliding distance along two different sliding directions (armchair and zigzag). For each structure, the sliding direction is defined in reference to the bottom layer. SP1 and SP2 indicate barrier heights at the saddle points. The lines represent different structures: 2H-MM, t-MM, a-GM, and t-GM. The barrier heights for the aligned structure 2H-MM are two to three orders of magnitude larger than for the three misaligned interfaces (t-MM, a-GM, and t-GM).

FIGS. 23A-23D show cross-sectional ADF-STEM images of: monolayer $MoS_2$ (M), twisted bilayer $MoS_2$ (t-MM), 2H-stacked bilayer $MoS_2$ (2H-MM), and a graphene-$MoS_2$ heterostructure (GM), respectively, where scale bars are 2 nm.

FIG. 23E shows a plot of experimental (diamonds) and DFT (circles) values of bending stiffness for each structure. 2H-MM, the only structure with an aligned interface, shows the widest spread in bending stiffness spanning 14-55 eV with a strong bending angle dependence, where higher bending angles tend to correspond to lower bending stiffnesses.

FIG. 24C provides experimental measurements and model predictions of bending stiffness (B) for structures without aligned interfaces: monolayer graphene, monolayer MoS$_2$, t-MM, GM, and GMGM. For each structure, the mean experimental B (crosses) is within 0.4 eV of the model predictions (line).

FIG. 24D shows bending stiffness versus thickness for aligned and twisted MoS$_2$ multilayers. The slope of B with thickness for misaligned stacks is much lower than that of the aligned stacks and equal to the monolayer bending stiffness.

FIG. 24E plots bending stiffness versus arc length for aligned and twisted multilayer MoS$_2$ with θ=10°. The bending stiffness of aligned stacks scales quadratically with the system size but is constant for mis-aligned stacks. The dashed lines indicate when the prediction becomes non-physical at small bend sizes where R approaches the thickness of the 2D monolayer stack.

DETAILED DESCRIPTION

A unique feature of 2D materials is that they can be isolated down to a single unit cell or monolayer and recombined almost arbitrarily through layer-by-layer stacking, thereby enabling independent control over individual interfaces and the opportunity to manipulate properties through interfacial engineering. Deformable electronic devices that exploit intentional and controlled interfacial misalignment between 2D monolayers to achieve reduced bending stiffness are described in this disclosure. This technology enables the fabrication of highly bent or curved layers and multilayer device structures with exceptional mechanical flexibility. Even in relatively thick layers, remarkably low bending stiffnesses may be obtained by controlling the number and/or location of misaligned interfaces. By systematically introducing interfacial misalignment into 2D multilayers and heterostructures, bending stiffness may be reduced by over several hundred percent.

Figure 1:
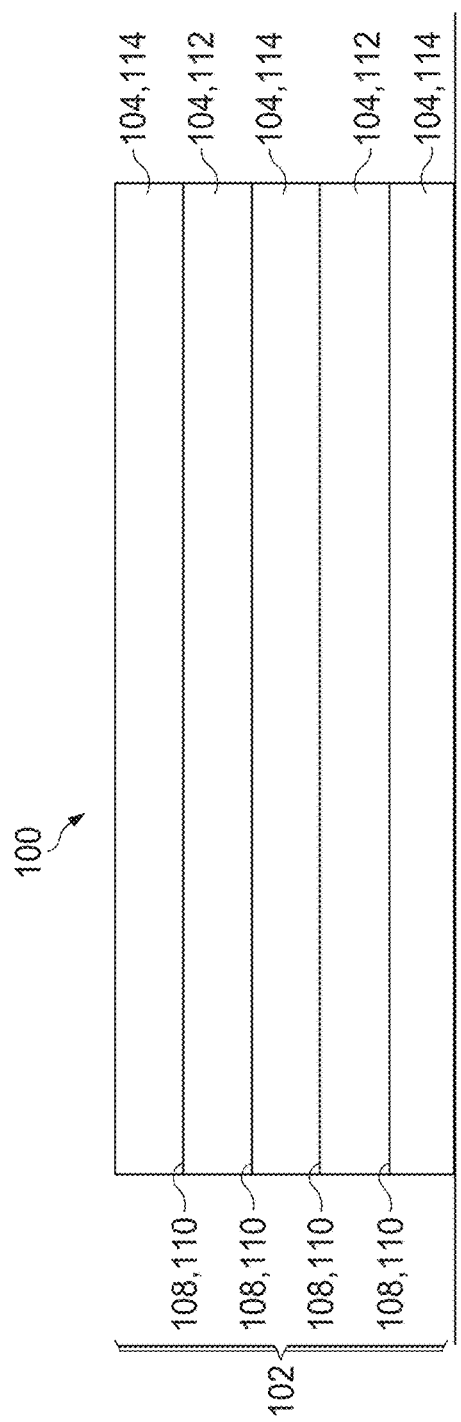
FIG. 1 shows a cross-sectional schematic of the deformable electronic device according to a first embodiment, where a misaligned interface is incorporated between adjacent functional layers to reduce bending stiffness. In this and other schematics, the deformable electronic device is shown to include five functional layers (e.g., electronically active layers and other layers having a dielectric, insulating, and/or protective function); however, the device may include any number of functional layers deemed suitable for the application.
Figure 2:
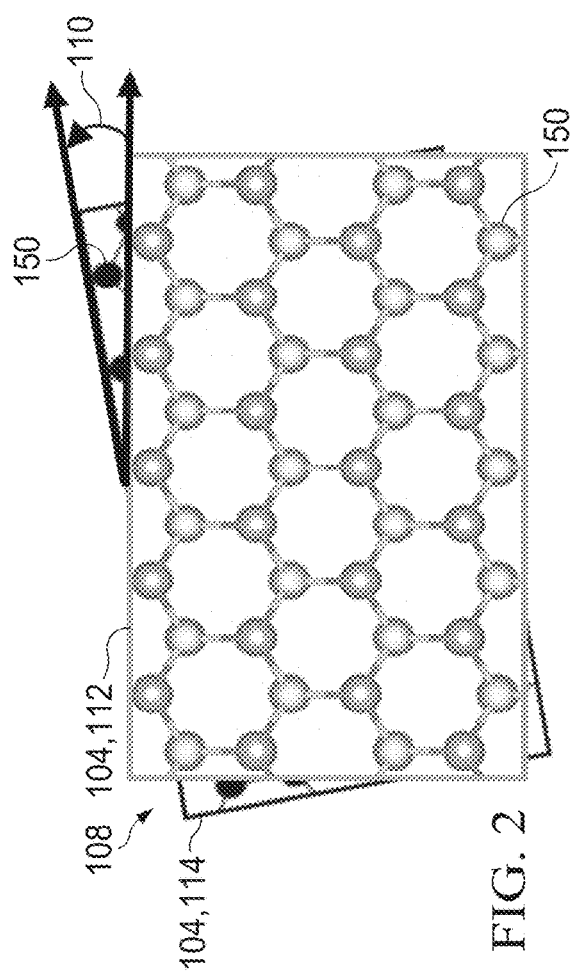
FIG. 2 shows an exemplary misaligned interface between adjacent functional layers of the deformable electronic device of FIG. 1, where the misaligned interface includes a twist angle between the layers.

Referring to FIG. 1, a first embodiment of the deformable electronic device 100 includes a multilayer device structure 102 comprising functional layers 104 on a flexible polymeric substrate 106, where each of the functional layers 104 comprises one or more 2D monolayers. The multilayer device structure 102 includes a misaligned interface 108 between adjacent (e.g., vertically adjacent or overlapping) functional layers 104 to promote deformability of the device 100, and further may include a plurality of the misaligned interfaces 108, as shown in FIG. 1. In this embodiment, each misaligned interface 108 comprises an angular offset or "twist angle" 110 between the adjacent functional layers 104, as illustrated in the schematic of FIG. 2, which shows a top-down view of an exemplary misaligned interface 108. The twist angle 110 is determined by the relative angular orientation of the 2D monolayers 150 of the adjacent functional layers 104, where a twist angle 110 of 0° corresponds to aligned 2D monolayers, and a nonzero value may result in interfacial misalignment. For adjacent functional layers 104 that each include more than one 2D monolayer 150, the angular orientation of the top-most 2D monolayer 150 of the lower functional layer 104 with respect to the bottom-most 2D monolayer 150 of the upper functional layer 104 defines the twist angle 110 between the functional layers 104. The multilayer device structure 102 may include a twist angle 110 between some or all of the adjacent functional layers 104.

Figure 3:
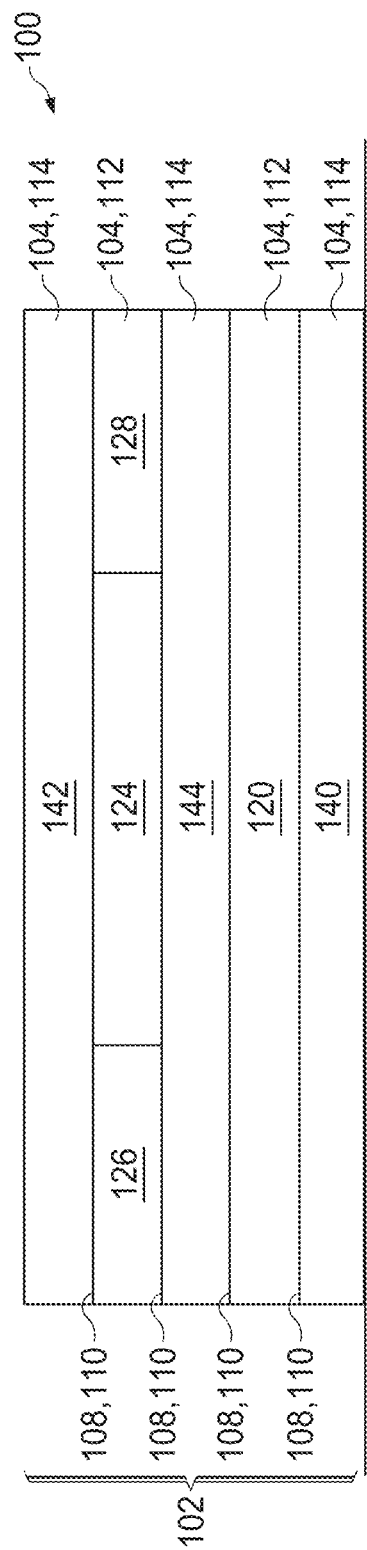
FIG. 3 shows a cross-sectional schematic of an exemplary field effect transistor comprising the interfacial misalignment of FIG. 2.

The functional layers 104 may include electronically active layers 112 and other layers 114, which may have a dielectric, insulating, and/or protective function. More specifically, as shown by the schematic of FIG. 3, the electronically active layers 112 may include a gate electrode 120, a channel 124, a source electrode 126, and a drain electrode 128, and the other layers 114 may include first and second encapsulation layers 140,142 and a dielectric layer (e.g., a tunnel layer) 144. Accordingly, the deformable electronic device 100 may comprise a field effect transistor 160. The deformable electronic device 100 may also or alternatively comprise a high electron mobility transistor, a bipolar junction transistor, a tunnel junction, a light emitting diode, a laser, a solar cell, and/or a sensor.

Enabled by the interfacial engineering described in this disclosure, the deformable electronic device 100 may have sufficient flexibility and/or stretchability to be wearable, portable, and/or reconfigurable (e.g., foldable and/or rollable). The deformable electronic device 100 may be part of a smart system configured for wireless communication and connectivity to facilitate interaction with user(s) and/or the environment.

The term "2D monolayer" as used in this disclosure refers to an atomically-thin sheet comprising an atomic or molecular species that repeats in two dimensions and which may be referred to as a two-dimensional (2D) material. Accordingly, a 2D monolayer 150 may be understood to comprise a 2D material. An exemplary 2D material is graphene, which comprises sp$^2$-bonded carbon atoms repeating in two dimensions. A stack of 2D monolayers 116, as shown schematically in several figures and discussed further below, is understood to include at least two 2D monolayers 150, and may include tens or hundreds of 2D monolayers 150. Stacks of 2D monolayers 116 characteristically exhibit weak interlayer van der Waals bonding, in contrast to the strong intralayer (in-plane) covalent bonding that is characteristic of 2D materials. The 2D monolayers 150 and the stacks of 2D monolayers 116 described in this disclosure may be formed by mechanical exfoliation from bulk crystals, chemical vapor deposition, monolayer transfer, and/or layer-by-layer stacking.

Exemplary 2D materials that may be employed for the 2D monolayers 150 and stacks of 2D monolayers 116 described in this disclosure include: graphene; silicene; germanene; phosphorene; transition metal dichalcogenides such as molybdenum disulfide (MoS$_2$), tungsten disulfide (WS$_2$), molybdenum diselenide (MoSe$_2$), tungsten diselenide (WSe$_2$), and molybdenum ditelluride (MoTe$_2$); semiconducting metal dichalcogenides such as tin disulfide (SnS$_2$) and tin diselenide (SnSe$_2$); hexagonal boron nitride (h-BN); beryllium oxide (BeO); transition metal oxides such as manganese oxide (MnO$_2$) and zinc oxide (ZnO); transition metal carbides; transition metal carbonitrides; and/or topological insulators such as bismuth selenide ($Bi_2Se_3$) and antimony telluride ($Sb_2Te_3$). Graphene is known for its exceptionally high mobility (fast charge transport) and thermal conductivity, and may be particularly well suited for electrodes. Phosphorene and the transition metal dichalcogenides also exhibit high mobilities and wide bandgaps, and may be well-suited as a channel material. Hexagonal boron nitride shows promise as a dielectric for insulating and protective layers.

Figure 4:
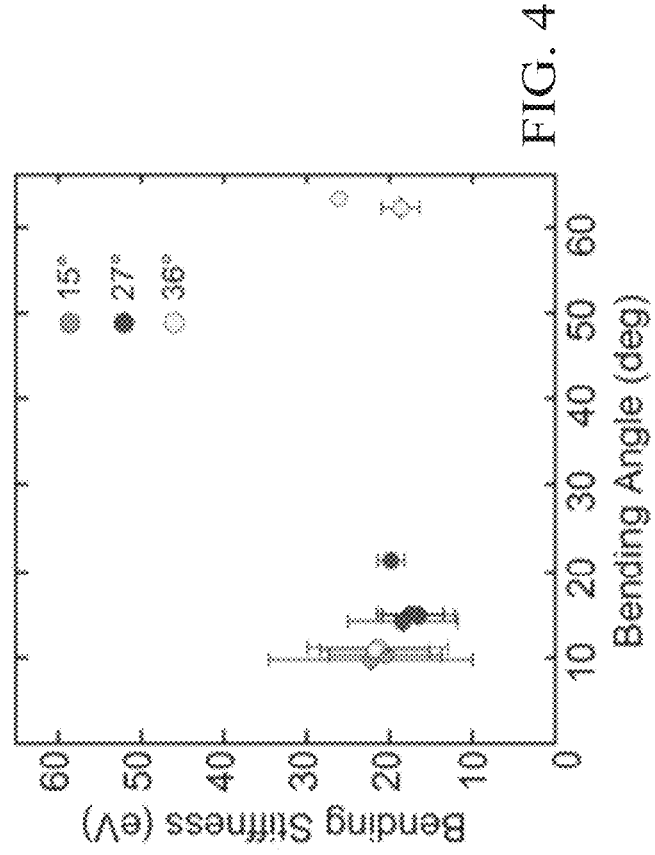
FIG. 4 plots bending stiffness as a function of twist angle for monolayers of $MoS_2$; the data show that a low bending stiffness is achieved for a range of twist angles, and further that bending stiffness appears to be independent of the magnitude of the twist angle.

Referring again to FIG. 1, vertically adjacent or overlapping functional layers 104 may be understood to define a 2D heterostructure composed of different 2D materials. Accordingly, dissimilar lattice constants of the adjacent functional layers 104 may inherently contribute to interfacial misalignment. However, the intentionally introduced twist or angular offset 110 between the adjacent functional layers 104, as illustrated in FIG. 2, may provide a means of controlling the extent of the interfacial misalignment and ensuring a desired reduction in bending stiffness. Typically, the twist angle 110 may be at least about 0.1° and as high as 180°, and more typically in the range from about 1° to about 60°. Data suggest that a range of twist angles (e.g., 15-36°) may be suitable for achieving low values of bending stiffness, as shown in FIG. 4, and the data further indicate that the reduction in bending stiffness may not depend on the magnitude of the twist angle.

Figure 5:
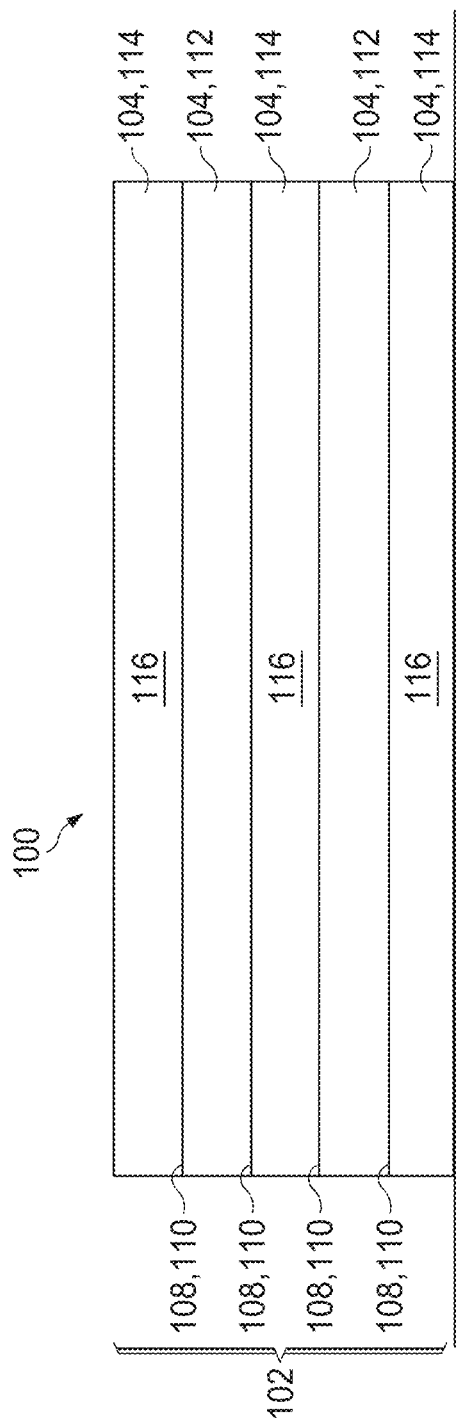
FIG. 5 shows the deformable electronic device of FIG. 1 further configured to include interfacial misalignment within the functional layers (specifically, within the other layers having a dielectric, insulating and/or protective function), where the interfacial misalignment includes a twist angle and/or lattice mismatch due to heterostructuring.
Figure 6:
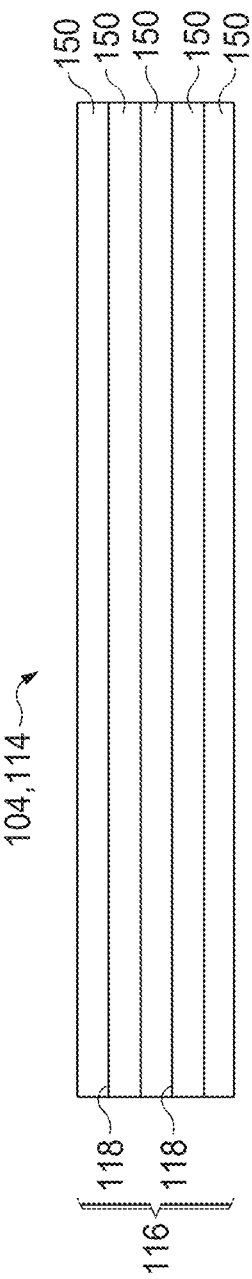
FIG. 6 shows a cross-sectional schematic of an exemplary other layer (e.g., a dielectric or encapsulation layer) comprising a stack of 2D monolayers that includes at least one misaligned interface within the stack. In this and other schematics, the stack is shown to include five 2D monolayers; however, the stack may include any number of 2D monolayers deemed suitable for the application (e.g., at least two and up to 300).

In addition to the twist angle 110 between functional layers 104, the multilayer device structure 102 may include interfacial misalignment within the functional layers 104 to reduce the bending stiffness. For example, at least one, some or all of the other layers 114 (e.g., the dielectric and encapsulation layers 144,142,140, which tend to be thicker layers) may comprise a stack of 2D monolayers 116 that includes at least one misaligned interface 118 within the stack 116, as illustrated in FIGS. 5 and 6. Typically, each stack of 2D monolayers 116 includes a plurality of misaligned interfaces within the stack 116. The misaligned interface(s) 118 in each of the stacks 116 may comprise a twist angle 110 between adjacent 2D monolayers 150 and/or lattice mismatch between adjacent 2D monolayers 150. The twist angle 110 is defined by the relative (in-plane) angular orientation of the adjacent 2D monolayers, and the lattice mismatch may be achieved by heterostructuring (or heterostacking), that is, by incorporating at least two different 2D materials having different lattice constants in the stack.

Figure 7:
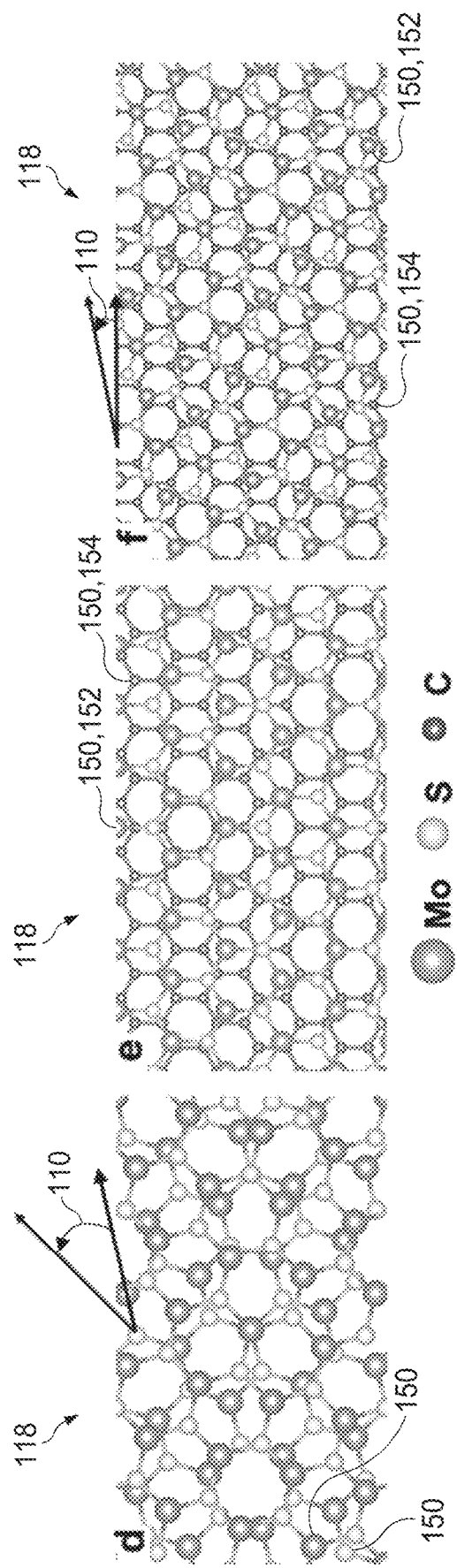
FIG. 7 shows exemplary misaligned interfaces including a twist angle between adjacent 2D monolayers and/or lattice mismatch due to heterostructuring.

Exemplary misaligned interfaces 118 are illustrated in the top-down views of FIG. 7. The left-most image illustrates a twist angle 110 between adjacent 2D monolayers 150, where, in this example, the twist angle is 32.2° and both 2D monolayers 150 comprise $MoS_2$. It is noted that any of the 2D materials described in this disclosure may be employed for the 2D monolayers 150 and misaligned interfaces 118 shown in FIG. 7 and described in various embodiments. The center image illustrates lattice mismatch due to heterostructuring of adjacent 2D monolayers 150 comprising, in this example, a top 2D monolayer 152 comprising $MoS_2$ aligned with a bottom 2D monolayer 154 comprising graphene. The right-most image illustrates the aligned 2D heterostructure of the center image with an added twist angle 110 of 10.9°. Suitable twist angles 110 may range from about 0.1° to about 180°, and more typically from about 1° to about 60°, as described above.

Figure 8:
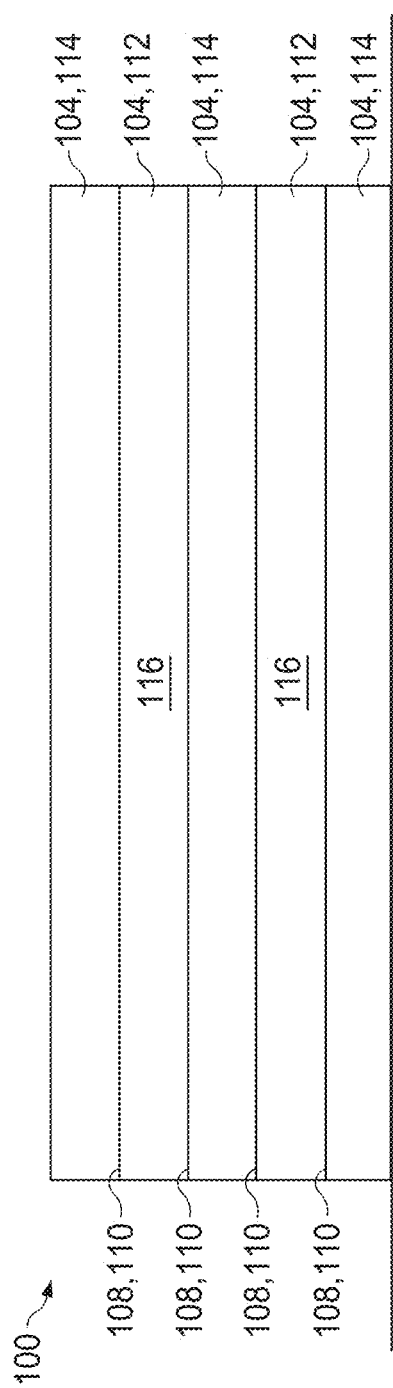
FIG. 8 shows the deformable electronic device of FIG. 1 further configured to include interfacial misalignment within the functional layers, specifically, within the electronically active layers.
Figure 9:
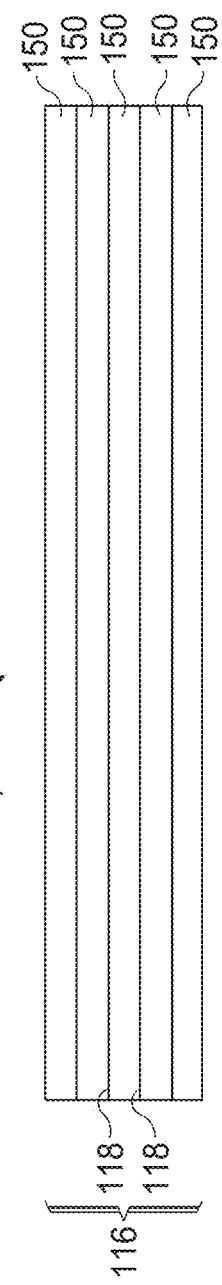
FIG. 9 shows a cross-sectional schematic of an exemplary electronically active layer (e.g., a channel or a gate electrode) comprising a stack of 2D monolayers that includes at least one misaligned interface within the stack.

The electronically active layers 112 of the deformable electronic device 100 may also or alternatively include interfacial misalignment. For example, as illustrated in FIGS. 8 and 9, one or more of the electronically active layers 112 may comprise a stack of 2D monolayers 116, and any of these stacks of 2D monolayers 116 may include one or more misaligned interfaces 118 within the stacks 116. Typically, each stack of 2D monolayers 116 includes a plurality of the misaligned interfaces 118, where each misaligned interface 118 may comprise a twist angle 110 between adjacent 2D monolayers 150 and/or lattice mismatch between adjacent 2D monolayers 150, e.g., as described above in reference to FIG. 7. As is known in the art, such interfacial misalignment may influence the electronic and/or optical properties of the electronically active layers 112. Notably, the electronically active layers 112 are typically very thin (e.g. <1-2 nm); the impact of interfacial misalignment on bending properties may be much more significant for thicker layers, such as the dielectric and encapsulation layers 144,142,140 (the other layers 114), which may have a thickness from about 3 nm to about 100 nm (individually), and more typically from about 5 nm to about 30 nm.

The inventors have recognized that bending stiffness may be tuned by controlling the number or proportion of misaligned interfaces 118 within the stacks of 2D monolayers 116. As explained above, the electronically active 112 and/or the other layers 114 may include such stacks 116. Each stack 116 may include from two to n of the 2D monolayers 150, where n is an integer as large as 300, and consequently each stack 116 may include from one to n−1 (e.g., 299) misaligned interfaces 118. More typically, n is 30 or less, and each stack 116 may include at least 5, at least 10, at least 15, at least 20, or at least 25, and/or as many as 29 misaligned interfaces 118. Each stack 116 may include the same number of misaligned interfaces 118, or the stacks 116 may include different numbers of misaligned interfaces 118. The proportion of misaligned interfaces 118 within each stack 116 may be at least about 0.3, at least about 0.5, at least about 0.8, and/or as high as 1.0.

Figure 10:
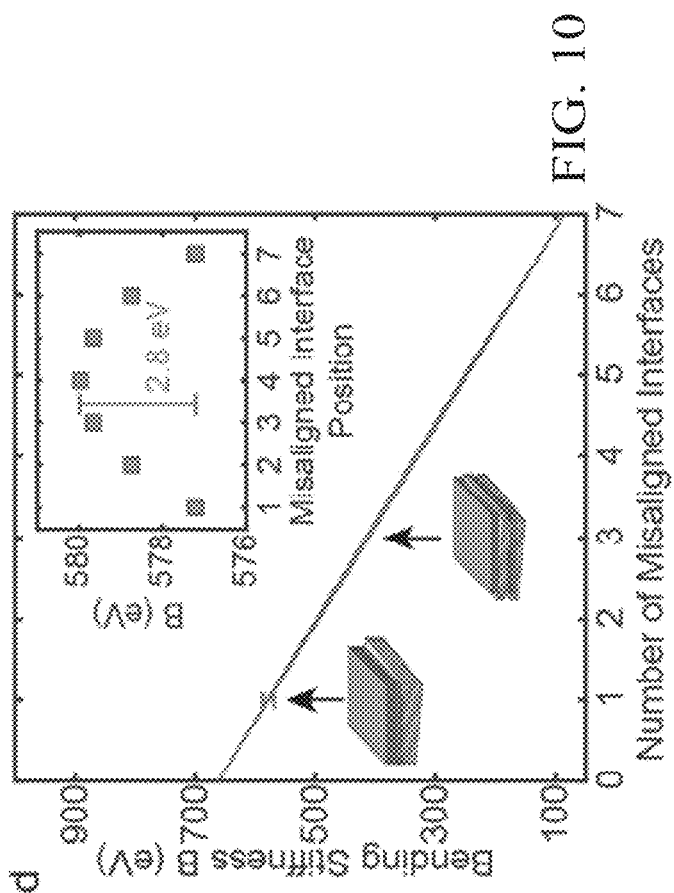
FIG. 10 plots bending stiffness (B) versus number of misaligned interfaces for an exemplary stack of 2D monolayers (8-layer $MoS_2$). The data show that B may be tuned by more than 600% with the number of misaligned interfaces in the stack. The inset shows dependence of bending stiffness on position of a misaligned interface for a structure containing one misaligned interface.

The inclusion of a high proportion or number of misaligned interfaces within each stack of 2D monolayers 116 to reduce bending stiffness is supported by the simulation data of FIG. 10, which predict how bending stiffness may vary as a function of number of misaligned interfaces for a stack comprising eight monolayers of $MoS_2$. FIG. 10 shows that bending stiffness is expected to decrease linearly as the number of misaligned interfaces in the stack of 2D monolayers increases. The simulation data also show (inset) the dependence of bending stiffness on the position of a misaligned interface for a stack containing only one misaligned interface.

Figure 11:
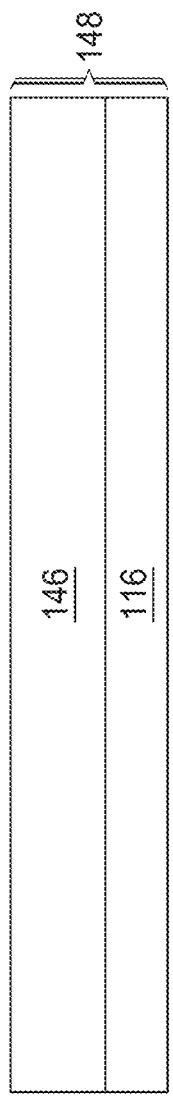
FIG. 11 shows a cross-sectional schematic of an exemplary functional layer having a composite structure that includes a conventional 3D film in conjunction with a stack of 2D monolayers to enhance deformability.

In some examples, one or more of the functional layers 104 may include a conventional three-dimensional (3D) film, which may be deposited by a method such as atomic layer deposition (ALD). It may be particularly beneficial for such functional layers 104 to have a composite structure 148 comprising the conventional 3D film 146 in conjunction with a stack of 2D monolayers 116, as illustrated in FIG. 11, to enhance the deformability of the layer 104. The stack of 2D monolayers 116 may be adjacent to or positioned within the conventional 3D film 146. Such a composite structure 148 may be particularly advantageous for the other layer(s) 114, which tend to be thicker and may benefit from the properties (e.g., dielectric properties) of conventional 3D films. For example, the composite structure 148 may include a conventional 3D dielectric film (e.g., a hafnium oxide film) 146 along with a stack 116 of hexagonal boron nitride monolayers for improved deformability.

Figure 12:
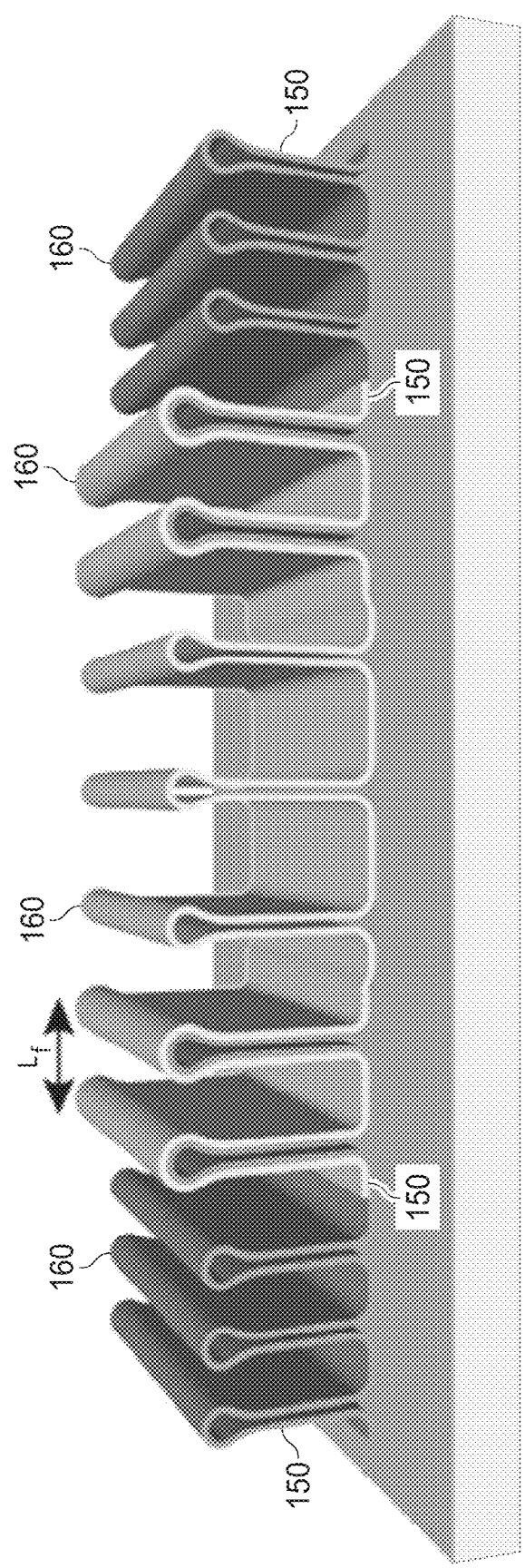
FIG. 12 shows 2D monolayers including folds or corrugations that may be referred to as crumples and which may impart stretchability to the deformable electronic device.
Figure 13:
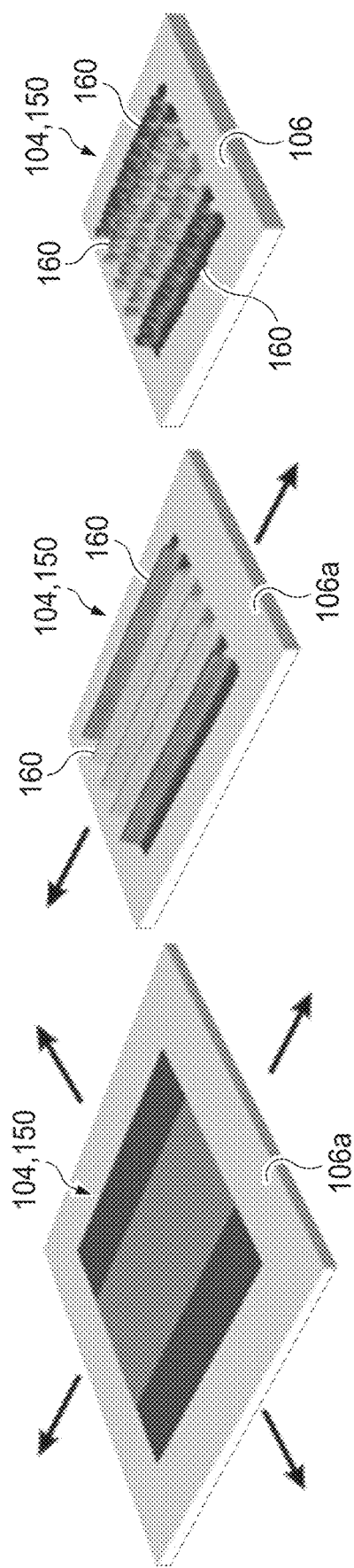
FIG. 13 shows an exemplary process to prepare a multilayer device structure including crumples.
Figure 14:
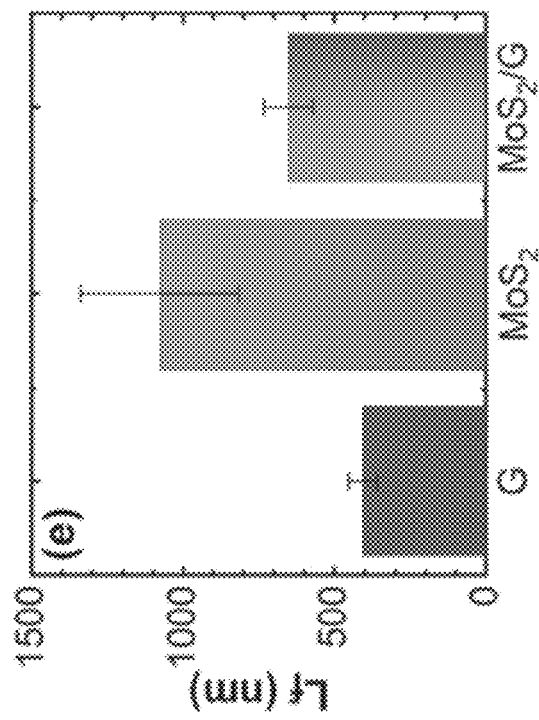
FIG. 14 shows average spacing ($L_f$) of crumples for 2D monolayers comprising different 2D materials.

The multilayer device stack 102 of the deformable electronic device 100 may also or alternatively include crumples 160, that is, folds or corrugations, in at least one of the 2D monolayers 150. A crumpled 2D monolayer 150 or stack of 2D monolayers 116 may be understood to include a plurality of crumples 160, as illustrated in FIG. 12, and consequently may be stretchable as well as bendable. To maximize the stretchability of the electronic device 100, most or all of the 2D monolayers 150 may be crumpled. Accordingly, most or all of the functional layers 104 of the multilayer device stack 102 may include crumples 160, and the multilayer device stack 102 may be described as being crumpled. The crumples 160 may be introduced by prestraining the polymeric substrate. For example, a stress may be applied to introduce strain into the polymeric substrate 106, forming a prestrained substrate 106a on which to form or transfer the functional layers 104, as illustrated in FIG. 13. After formation and/or transfer of the functional layers 104, the stress may be released and the strain recovered, leading to compression and crumpling of the 2D monolayers 150 (and consequently the functional layers 104) and the formation of a crumpled multilayer device structure 102. The prestrained polymeric substrate 106a may be uniaxially or biaxially strained, leading to, upon release of the applied stress, compression of the 2D monolayers 150 of the functional layers 104 along one or two axes. The resulting crumples 160 may have an average spacing ($L_f$) in a range from about 300 nm to about 1200 nm, depending on the 2D material(s) of the monolayers, as shown for several examples in FIG. 14. Suitable polymeric substrates 106 may comprise an elastomeric polymer such as polydimethylsiloxane (PDMS) that is capable of being strained in excess of 100% and/or as high as 300%, or higher.

Figure 17:
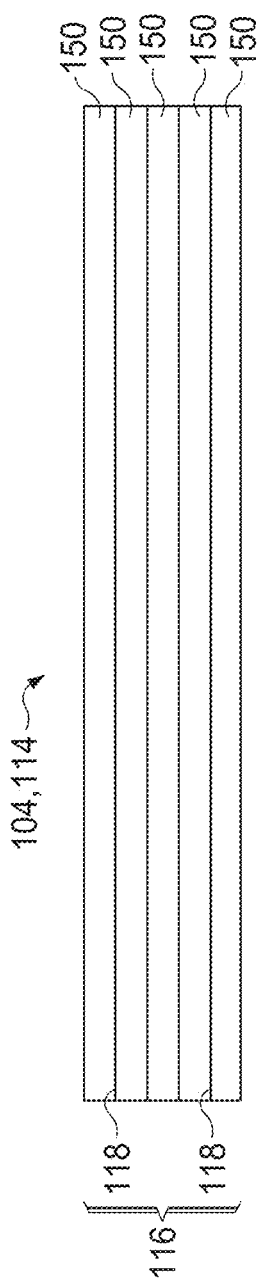
FIG. 17 shows a cross-sectional schematic of an exemplary other layer (e.g., a dielectric or encapsulation layer) comprising a stack of 2D monolayers that includes at least one misaligned interface within the stack.

Referring to FIG. 15, a second embodiment of the deformable electronic device 200 includes a multilayer device structure 102 comprising functional layers 104 on a flexible polymeric substrate 106. The functional layers 104 include electronically active layers 112 and other layers 114, which may have a dielectric, insulating, and/or protective function and which tend to be thicker layers. In this embodiment, at least one, some or all of the other layers 114 comprise a stack of 2D monolayers 116. To promote three-dimensional deformability of the electronic device 200, each of the stacks 116 includes at least one misaligned interface 118, as illustrated in FIG. 17, which shows an exemplary other layer 114. Typically, each stack 116 includes a plurality of the misaligned interfaces 118.

The other layers 114 may include, as shown in FIG. 16, a first encapsulation layer 140, a second encapsulation layer 142, and/or a dielectric layer 144, and the electronically active layers 112 may include a gate electrode 120, a channel 124, a source electrode 126, and/or a drain electrode 128. Accordingly, the deformable electronic device 200 may comprise a field effect transistor, as in the first embodiment. The deformable electronic device 200 may also or alternatively comprise a high electron mobility transistor, a bipolar junction transistor, a tunnel junction, a light emitting diode, a laser, a solar cell, and/or a sensor.

The misaligned interface(s) 118 in each of the stacks 116 may comprise a twist angle 110 and/or lattice mismatch between adjacent 2D monolayers 150. The twist angle 110 is determined by the relative angular orientation of the adjacent 2D monolayers, and lattice mismatch may be achieved by heterostructuring (or heterostacking), that is, incorporating at least two different 2D materials having different lattice constants in the stack. Suitable twist angles 110 may range from about 0.1° to about 180°, and may be more typically from about 1° to about 60°. Exemplary twist angles and lattice mismatch are illustrated in the top-down views of misaligned interfaces 118 in FIG. 7, which was described above.

Figure 18:
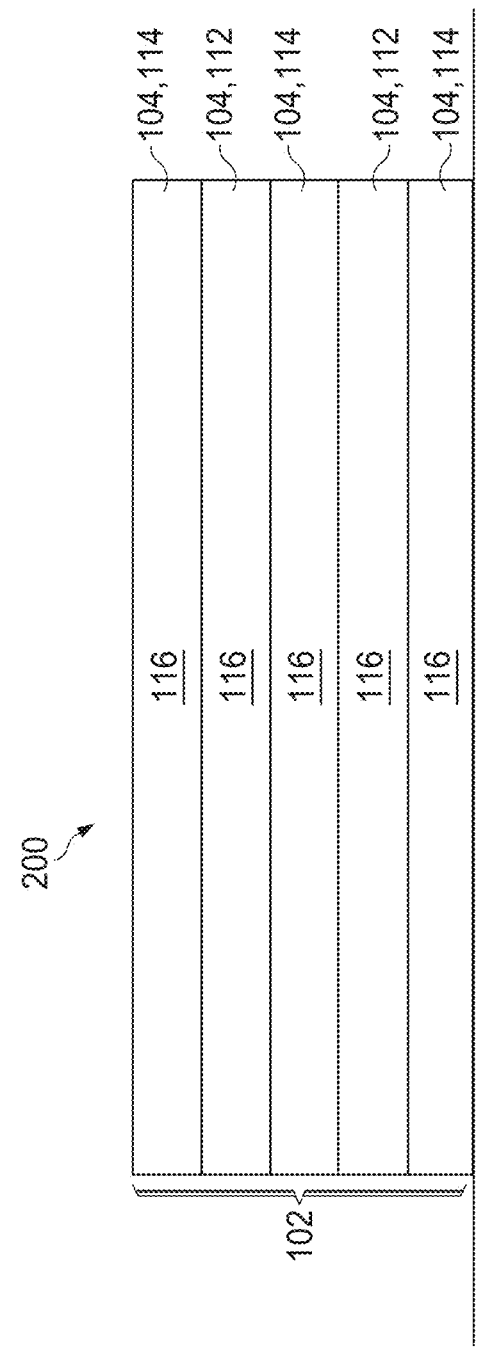
FIG. 18 shows the deformable electronic device of FIG. 15 further configured to include interfacial misalignment within the electronically active layers.
Figure 19:
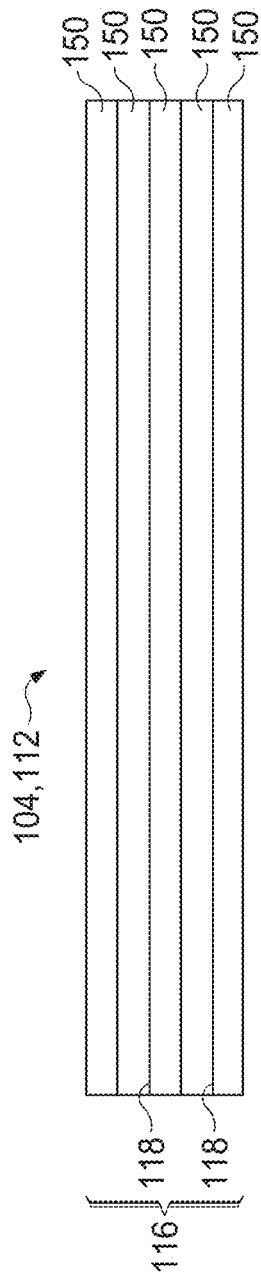
FIG. 19 shows a cross-sectional schematic of an exemplary electronically active layer comprising a stack of 2D monolayers that includes at least one misaligned interface within the stack.

The electronically active layers 112 of the deformable electronic device 200 may include 2D monolayers and, optionally, interfacial misalignment. For example, as illustrated in FIGS. 18 and 19, one or more of the electronically active layers 112 may comprise at least one 2D monolayer or a stack of 2D monolayers 116, and any of these stacks of 2D monolayers 116 may include one or more misaligned interfaces 118. Typically, each stack includes a plurality of the misaligned interfaces 118 where each misaligned interface 118 may comprise a twist angle 110 between adjacent 2D monolayers 150 and/or lattice mismatch between adjacent 2D monolayers 150, e.g., as described above in reference to FIG. 7. As is known in the art, such interfacial misalignment may influence the electronic and/or optical properties of the electronically active layers 112. Notably, the electronically active layers 112 are typically very thin (e.g. <1-2 nm); the impact of interfacial misalignment on bending properties may be much more significant for thicker layers, such as the dielectric and encapsulation layers 144, 142,140 (the other layers 114), which may have a thickness from about 3 nm to about 100 nm (individually), and more typically from about 5 nm to about 30 nm.

As indicated above, the inventors have recognized that bending stiffness may be tuned by controlling the number or proportion of misaligned interfaces 118 within the stacks of 2D monolayers 116. As illustrated in FIGS. 17 and 19, the electronically active 112 and/or the other layers 114 may include such stacks 116. Each stack of 2D monolayers may include from two to n of the 2D monolayers, where n is an integer as large as 300, and consequently each stack may include from one to n−1 (e.g., 299) misaligned interfaces. More typically, n is 30 or less, and each stack 116 may include at least 5, at least 10, at least 15, at least 20, or at least 25, and/or as many as 29 misaligned interfaces 118. Each stack 116 may include the same number of misaligned interfaces 118, or the stacks 116 may include different numbers of misaligned interfaces 118. The proportion of misaligned interfaces 118 within each stack 116 may be at least about 0.3, at least about 0.5, at least about 0.8, and/or as high as 1.0. The inclusion of a high proportion or number of misaligned interfaces within each stack of 2D monolayers 116 to reduce bending stiffness is supported by the simulation data of FIG. 10, which was discussed above.

In some examples, one or more of the functional layers 104 of the deformable electronic device 200 may comprise a conventional three-dimensional (3D) film, which may be deposited by a method such as atomic layer deposition (ALD). It may be particularly beneficial for such functional layers 104 to have a composite structure 148 comprising the conventional 3D film 146 in conjunction with a stack of 2D monolayers 116 to enhance the deformability of the layer 104, as illustrated in FIG. 11. The stack of 2D monolayers 116 may be adjacent to or positioned within the conventional 3D film 146. Such a composite structure 148 may be particularly advantageous for the other layer(s) 114, which tend to be thicker and may benefit from the properties (e.g., dielectric properties) of conventional 3D films. For example, the composite structure 148 may include a conventional 3D dielectric film (e.g., a hafnium oxide film) 146 along with a stack 116 of hexagonal boron nitride monolayers for improved deformability.

Figure 20:
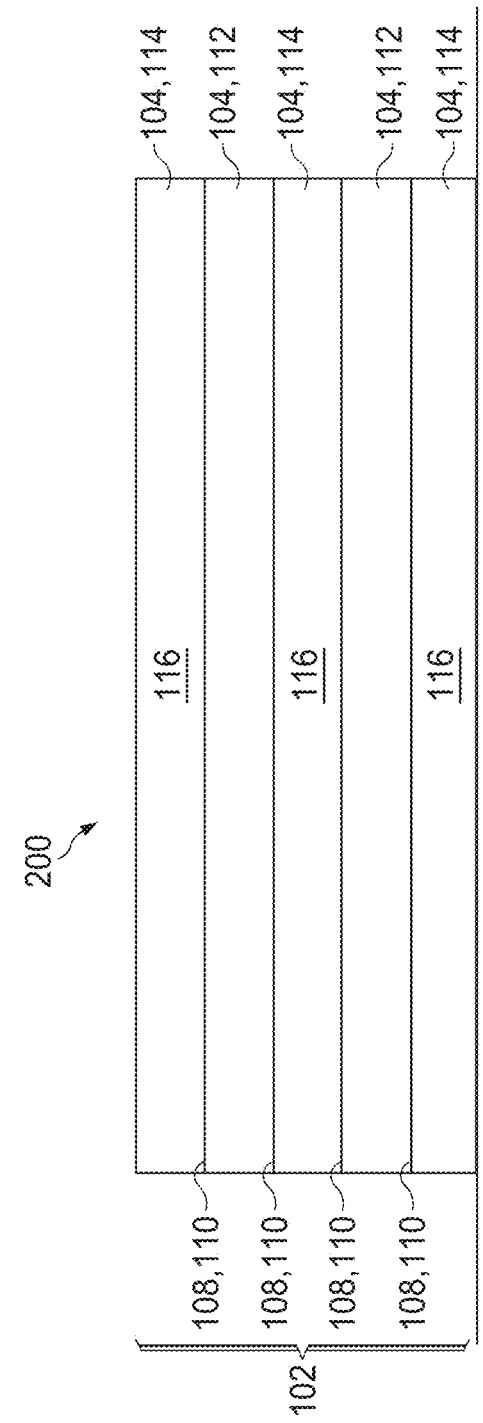
FIG. 20 shows the deformable electronic device of FIG. 15 further configured to include interfacial misalignment (a twist angle) between adjacent functional layers.

In examples where each of the functional layers 104 comprises at least one 2D monolayer, the multilayer device structure 102 may further include a misaligned interface 108 between adjacent (e.g., vertically adjacent or overlapping) functional layers 104, as indicated in FIG. 20. More specifically, each misaligned interface 108 may comprise a twist angle 110 between the 2D monolayers of the adjacent functional layers 104, as illustrated in FIG. 2. For adjacent functional layers 104 that include more than one 2D monolayer, the angular orientation of the top-most 2D monolayer 150 of the lower functional layer 104 with respect to the bottom-most 2D monolayer 150 of the upper functional layer 104 defines the twist angle 110 between the functional layers 104. The deformable electronic device 200 may include a twist angle 110 between some or all of the adjacent functional layers 104 in the multilayer device structure 102. The intentional introduction of a twist angle 110 between adjacent functional layers 104 may provide another knob to turn as far as controlling the deformability of the device 200.

The deformable electronic device 200 may also or alternatively include crumples, that is, folds or corrugations in at least one of the 2D monolayers 150. A crumpled 2D monolayer 150 or stack of 2D monolayers 160 may be understood to include a plurality of crumples and may be stretchable as well as bendable, as illustrated in FIG. 12. To maximize the stretchability of the electronic device 200, most or all of the 2D monolayers 150 may be crumpled. The crumples 160 may be introduced as described in the first embodiment and as illustrated in FIG. 13, e.g., by applying a stress to form a prestrained polymeric substrate 106a, forming the functional layers 104 on or transferring the functional layers 104 onto the prestrained polymeric substrate 106a, and then releasing the applied stress to induce compression and crumpling of the 2D monolayers 150 of the functional layers 104. The prestrained polymeric substrate 106 may be uniaxially or biaxially strained, leading to, upon release of the applied stress, compression of the 2D monolayers of the functional layers 104 along one or two axes. The resulting crumples 160 may have an average spacing ($L_f$) in a range from about 300 nm to about 1200 nm, depending on the 2D material(s) of the monolayers, as shown for several examples in FIG. 14. Suitable polymeric substrates 106 may comprise an elastomeric polymer such as polydimethylsiloxane (PDMS) that is capable of being strained in excess of 100% and/or as high as 300%, or higher.

Advantageously, due to the interfacial engineering described in this disclosure, the deformable electronic device 200 may have sufficient flexibility and/or stretchability to be wearable, portable, and/or reconfigurable (e.g., foldable and/or rollable). The deformable electronic device 200 may be part of a smart system configured for wireless communication and connectivity to facilitate interaction with user(s) and/or the environment.

In addition to the embodiments of the deformable electronic device 100,200 described above, methods of making a deformable electronic device are also set forth.

According to a first example, the method comprises forming a multilayer device structure comprising functional layers on a flexible substrate. At least one of the functional layers comprises a stack of 2D monolayers, and a number or proportion of misaligned interfaces within each of the stacks of 2D monolayers is controlled to obtain a predetermined bending stiffness. Each misaligned interface may comprise a twist angle and/or lattice mismatch between adjacent 2D monolayers. The functional layers may include electronically active layers and other layers, which may have a dielectric, insulating, and/or protective function.

Controlling the number of misaligned interfaces may comprise forming the stacks to include the same number of misaligned interfaces or different numbers of misaligned interfaces. The proportion of misaligned interfaces may be controlled to be at least about 0.3, at least about 0.5, at least about 0.8, and/or as high as 1.0 within each stack. Individual stacks may include from two to n of the 2D monolayers, where n is an integer as large as 300, and consequently each stack may include from one to n−1 (e.g., 299) of the misaligned interfaces. More typically, n is 30 or less, and each stack may include at least 5, at least 10, at least 15, at least 20, or at least 25, and/or as many as 29 misaligned interfaces. Reductions in bending stiffness may be correlated with an increase in the number and/or proportion of misaligned interfaces within the stacks of 2D monolayers.

The multilayer device may further be formed to include a twist angle as described above between some or all of the adjacent functional layers. The method may also or alternatively comprise forming crumples in the multilayer device structure. The multilayer device stack, the electronically active layers, the other layers (e.g., dielectric and encapsulation layers), and any misaligned interfaces formed by the method may have any of the characteristics, properties, and/or functions described in this disclosure.

According to a second example, a method of making a deformable electronic device comprises forming a multilayer device structure comprising functional layers on a flexible polymeric substrate, where each of the functional layers comprises one or more 2D monolayers. The multilayer device is formed to include a misaligned interface, or more specifically, a twist angle, between some or all of the adjacent functional layers. The twist angle may lie in a range from about 0.1° to about 180°, or more typically from about 1° to about 60°.

The functional layers may comprise electronically active layers and other layers (e.g., dielectric and/or encapsulation layers). At least one, some or all of the electronically active layers and/or the other layers may comprise a stack of 2D monolayers, where each of the stacks of 2D monolayers is formed to include at least one misaligned interface, which may comprise a twist angle and/or lattice mismatch, as described above. The number and/or proportion of misaligned interfaces within each stack may be controlled to obtain a predetermined bending stiffness, also as described above. The method may further include forming crumples in the multilayer device structure. The multilayer device stack, the electronically active layers, the other layers, and any misaligned interfaces formed by the method may have any of the characteristics, properties, and/or functions described in this disclosure.

According to a third example, the method of making a deformable electronic device comprises forming a multilayer device structure comprising functional layers on a flexible substrate, where the functional layers include electronically active layers and other layers. At least one, some or all of the other layers comprise a stack of 2D monolayers, and each of the stacks of 2D monolayers is formed to include at least one misaligned interface, which may comprise a twist angle and/or lattice mismatch between adjacent 2D monolayers. The method may further comprise controlling a number or proportion of misaligned interfaces within each of the stacks of 2D monolayers to obtain a predetermined bending stiffness, as described above.

One or more of the electronically active layers may also comprise a stack of 2D monolayers formed to include at least one misaligned interfaces. Also or alternatively, the multilayer device structure may be formed to include a twist angle between some or all of the adjacent functional layers. In some cases, the method may comprise forming crumples in the multilayer device structure.

In each of the above examples, the multilayer device structure and the functional layers, which may include conventional 3D films in addition to 2D monolayers and/or stacks of 2D monolayers, may be formed by chemical vapor deposition, physical vapor deposition, atomic layer deposition, mechanical exfoliation from bulk crystals, monolayer transfer, and/or layer-by-layer stacking, as known in the art. More specifically, the 2D monolayers are typically formed by chemical vapor deposition or exfoliation from bulk crystals, and the stacks of 2D monolayers may be formed by monolayer transfer and stacking methods, where the alignment or angular offset (twist angle) between adjacent 2D monolayers and the composition of each 2D monolayer (e.g., for heterostructuring) are controlled during stacking.

Theoretical and Experimental Underpinnings

Overview

The bending stiffness of 2D multilayers and heterostructures is experimentally and computationally measured while systematically engineering commensurate, twisted or heterointerfaces by varying the ordering of the layers. A simple model, adapted from continuum laminated and Timoshenko beam theories, is built to predict and design the bending stiffness of arbitrary 2D heterostructures. In this model, the complex mechanics of 2D heterostructures are reduced to two simple, measurable components: a contribution from each atomic layer and a contribution from each interface. Using this model, it is shown that incorporating interlayer twist and heterointerfaces reduces the interfacial friction nearly to zero. By controlling the number and position of such misaligned interfaces, the bending stiffness may be varied by several hundred percent. A particularly interesting limit occurs when each atomic layer is separated by misaligned hetero- or twisted interfaces. In such systems, the bending stiffness of the overall structures is shown to scale as the linear sum of the bending stiffness of each individual layer. This limit represents the theoretical lower limit of bending stiffness of 2D heterostructures. Such control may be instrumental in the design of emerging classes of devices that take advantage of the low intrinsic bending stiffness of atomically thin films to create highly deformable devices, including nanoscale origami or kirigami machines and flexible 2D electronics.

Results and Discussion

FIG. 21 demonstrates that interfacial engineering may offer profound control over the bending stiffness of 2D multilayers and heterostructures. The bending of four-layer 2D heterostructures formed from stacks of graphene and $MoS_2$ draped over discrete atomic steps in hexagonal boron nitride (h-BN), shown graphically in FIG. 21A, are studied. By using h-BN steps of different heights, the degree of deformation of the laminated structure may be varied. This configuration allows for application of controlled out-of-plane deformations to 2D materials and measurement of the resulting bends using aberration-corrected scanning transmission electron microscopy (STEM).

FIGS. 21B-21E show cross-sectional STEM images of four-layer heterostructures on h-BN steps in different stacking orders: graphene/$MoS_2$/graphene/$MoS_2$ (GMGM), $MoS_2$/Bernal-stacked bilayer graphene/$MoS_2$ (MGGM), graphene/2H-stacked bilayer $MoS_2$/graphene (GMMG), and 2H-stacked bilayer $MoS_2$/Bernal-stacked bilayer graphene (MMGG), respectively. Inverted stacking orders are categorized (e.g., GMGM vs. MGMG, or MMGG vs. GGMM) together in the figures. Because each heterostructure is composed of the same constituent layers, any differences in bending properties must result from the differences in their interfacial interactions.

To fabricate these structures, dry pickup and transfer methods are used to sequentially pick up monolayer or bilayer graphene and $MoS_2$. Such methods may be used to fabricate any of the multilayer device structures described in this disclosure. The bilayer components in the investigated structures are obtained via mechanical exfoliation from bulk crystals and are Bernal-stacked for bilayer graphene and 2H-stacked for $MoS_2$. These materials are of similar quality to those used in many 2D heterostructure friction experiments; due to their low defect concentration, defects are not expected to contribute a measurable effect to the bending measurements. Next, these heterostructures are transferred onto atomically sharp h-BN steps and the samples are annealed at 350° C. for 10 h. Raman spectroscopy and atomic force microscopy (AFM) are used to confirm the cleanliness and uniformity of the heterostructures, and then cross-sectional TEM samples are prepared using standard focused ion beam lift-out procedures.

Cross-sectional STEM imaging offers a powerful platform for measuring the bending stiffness of 2D materials. First, the bending profiles of the heterostructures in each STEM image are measured, specifically the radius of curvature R, bending angle θ, and h-BN step height H, as shown in FIG. 21E. Bending angle is defined as the angle subtending the two lines perpendicular to the straight sections on either side of the bend. By assuming the structure is in thermodynamic equilibrium, a simple energetic model in which the conformation is governed by a competition between adhesion and bending is then applied. Bending stiffness is calculated from the geometric parameters from each STEM image, using the following equation:

$$B = R\Gamma\left(\frac{H - 2R(1 - \cos\theta)}{\sin^2\theta}\right) \quad (1)$$

Here, B is the bending stiffness or flexural rigidity of the material stack, similar to the continuum bending stiffness of isotropic materials EI, rather than the stiffness of the entire structure. Γ is the interfacial adhesion energy between the bottom layer of the stack and the h-BN substrate (126 mJ $m^{-2}$ for graphene/h-BN and 136 mJ $m^{-2}$ for $MoS_2$/h-BN). For each heterostructure, several bending profiles are imaged and measured—35 different steps in total. In calculating B, the two biggest sources of error stem from the measurement of the geometric parameters and uncertainty in the adhesion energy Γ. Despite these potential sources of error, the methods used here have been shown previously to provide highly accurate and precise measurements of B for 2D materials.

FIG. 21F shows the extracted bending stiffness of each four-layer heterostructure. Notably, while the minimum values of B for all four structures cluster around 20 eV, the range of B increases with the number of aligned interfaces in the stack. The bending stiffness of MMGG, where $MoS_2$ and graphene occur as aligned bilayers, shows the widest spread of 20-80 eV. In contrast, the bending stiffnesses of GMGM, where the graphene and $MoS_2$ layers alternate, are tightly clustered between 20-26 eV. Another difference emerges when the dependence of bending stiffness on bending angle is examined. The bending stiffnesses are inversely correlated with bending angle for the three structures that contain aligned interfaces (MGGM, GMMG, and MMGG), while no bending angle dependence for GMGM is observed. These data demonstrate the key role of interfaces in tuning the bending stiffness of 2D heterostructures—they determine both the quantitative values and the bending angle-dependent trends in B.

In FIGS. 22A-22E, density functional theory (DFT) is used to simulate the interfacial interactions present in a 2H-stacked bilayer $MoS_2$ (2H-MM), twisted bilayer $MoS_2$ (t-MM), and graphene-$MoS_2$ (GM) heterostructure. These bilayers represent the different interface types in 2D multilayers: an aligned interface between like materials (2H-MM) and misaligned interfaces from either interlayer twist (t-MM) or lattice mismatch (GM). The term "misaligned" is used to encompass both commensurate and incommensurate twisted and heterointerfaces because it is found that the structures behave similarly. FIGS. 22A-22D shows top-down schematics for 2H-MM, t-MM (for twist angle φ=36.6°) and GM (for φ=0° and φ=10.9°. FIG. 22E shows the simulated sliding energy landscape for each bilayer, representing the energy required to displace one layer relative to the other along each of two directions: armchair (AC) <1100> and zigzag (ZZ) <2110>. In each structure, the sliding direction is defined in reference to the bottom layer. 2D multilayers bend primarily via interlayer shear and slip, where each atomic layer slides to accommodate the geometric arc length differences. In this context, the interfacial sliding energy barrier contributes to the effective bending stiffness of the 2D stack because it resists slip. The sliding energy barrier height for 2H-MM is 1-2 eV $nm^{-2}$, two orders of magnitude larger than those for t-MM and GM (0.01-0.02 eV $nm^{-2}$), consistent with the Frenkel-Kontorova model, which describes the origin of reduced interlayer friction in 2D multilayers at heterointerfaces and twisted interfaces. These plots also show that the interlayer friction is strongly dependent on the sliding direction and crystallographic bending direction for aligned bilayer $MoS_2$ but not for twisted interfaces and heterointerfaces. Similar results are obtained for the 1T phase of $MoS_2$. By directly comparing 2H-MM, t-MM, and GM, these studies show that either introducing twist or heterointerfaces reduces the interlayer sliding energy barrier, and can therefore reduce the bending stiffness of 2D stacks.

Figures 23F, 23G:
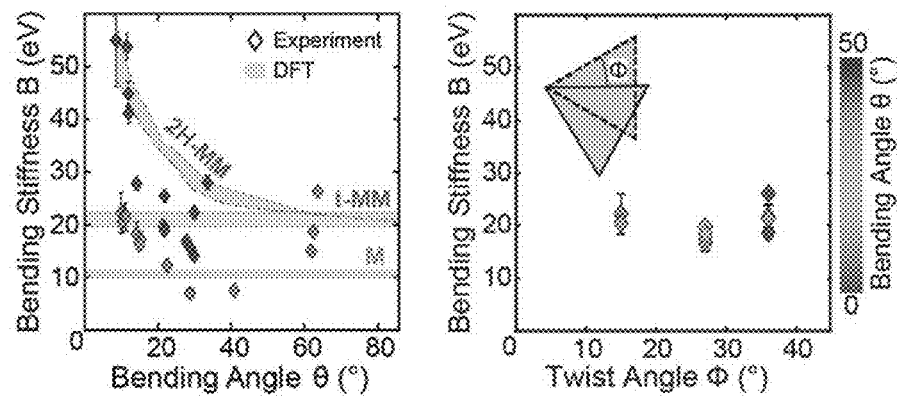
FIG. 23F shows bending stiffness versus bending angle for 2H-MM, t-MM, and M, where the error bars represent one standard error propagated from measurement precision. The upper and lower limits of the shaded regions indicate DFT predictions for bending along the zigzag and armchair directions. 2H-MM converges with t-MM at high bending angles.
FIG. 23G plots bending stiffness as a function of twist angle for twisted bilayer MoS$_2$; no impact of bending stiffness on twist angle or bending angle is observed.

Also investigated is how differing interlayer interactions of twisted, aligned, and heterointerfaces may affect the bending properties of 2D bilayers t-MM, 2H-MM, and GM. FIGS. 23A-23D are cross-sectional STEM images of monolayer $MoS_2$ (M), t-MM, 2H-MM, and GM bent over h-BN steps. FIGS. 23E and 23F plot the experimental and DFT calculations of B for each structure. In the DFT simulations, the bending stiffness is evaluated by measuring the energy required to deform the bilayers into rippled structures. In FIG. 23E, strong agreement is observed between experimental and DFT values. For monolayer $MoS_2$, a mean B of 10.1±0.3 eV is obtained from DFT and 10.5±3.8 eV from experiment, consistent with literature values. For the bilayer structures, FIGS. 23E and 23F show a strong bending angle-dependent bending stiffness for the aligned interface in 2H-MM, but not for the twisted and heterointerfaces in t-MM and GM. FIG. 23G examines the bending stiffness of twisted bilayer $MoS_2$ as a function of interlayer twist angle. It is found that the bending stiffness of t-MM does not exhibit a measurable dependence on the interlayer twist angle.

The data can be understood by breaking down the bending stiffness of 2D multilayers and heterostructures into contributions from each constituent monolayer and interface. For the misaligned or twisted structures, the experimental measurements yield $B_{t-MM}$=20.3±2.8 eV and $B_{GM}$=11.8±1.9 eV, very close to the sum of bending stiffness of their individual component layers. These data indicate that misaligned interfaces either from heterointerfaces or nonzero twist angles provide a negligible interfacial contribution to the bending stiffness. These results are expected to hold for any misaligned interface where there is not significant lattice reconstruction, which may alter the interlayer friction.

In contrast, the interfacial contribution to the bending stiffness for aligned multilayers is comparable to or even larger than the intrinsic bending stiffness of the individual layers across a wide range of bending angles. The bending stiffness of bilayer 2H-MM gradually decreases from 60 to 20 eV with increasing bending angle, converging to that of t-MM for bending angles above 30-60°. This trend echoes what has previously been observed in aligned few-layer graphene, and is a result of the reduction of the interlayer atomic registry and corresponding reduction in the interlayer friction as the material is bent. From this trend, it may be concluded that the additional bending stiffness at low bending angles arises from interfacial interactions. For example, a 2H-MM structure is measured at a bending angle of 10°, finding an effective bending stiffness of 55 eV, reflecting a contribution of 21 eV from the intrinsic bending stiffness of the two $MoS_2$ layers and 34 eV from the interfacial interactions.

Using these insights, a model is developed to predict and design the bending stiffness of arbitrary 2D heterostructures:

$$B = \sum_{i}^{N} B_{ml,i} + \sum_{j}^{N-1} a \cdot S_j(\theta) \cdot (R_j \cdot \theta)^2 \quad (2)$$

where N is the total number of layers, $B_{ml,i}$ is the monolayer bending stiffness of the $i^{th}$ layer, a is a geometric factor that describes the boundary conditions, and θ is the bending angle. $R_j$ and $S_j(\theta)$ are respectively the radius of curvature and interfacial shear energy at the $j^{th}$ interface. While graphene and $MoS_2$ are the focus of this work, this model is believed to be generalizable across van der Waals bonded materials. The model is an atomistic version of continuum anisotropic Timoshenko and laminated beam theories, where the material and interfacial values arise from discrete and nonlinear atomic scale interactions rather than continuum linear elastic constants or the Amonton-Coulomb description of friction. A key term in this equation is the interfacial shear energy Sj(θ), which represents the contribution of an interface to the total bending energy. S(θ) in aligned interfaces is distinct from the continuum shear modulus G because it is not a constant, but instead depends on bending angle. Because S is dependent on the atomic arrangements at each interface, it can be directly manipulated via interfacial engineering.

Figures 24A, 24B:
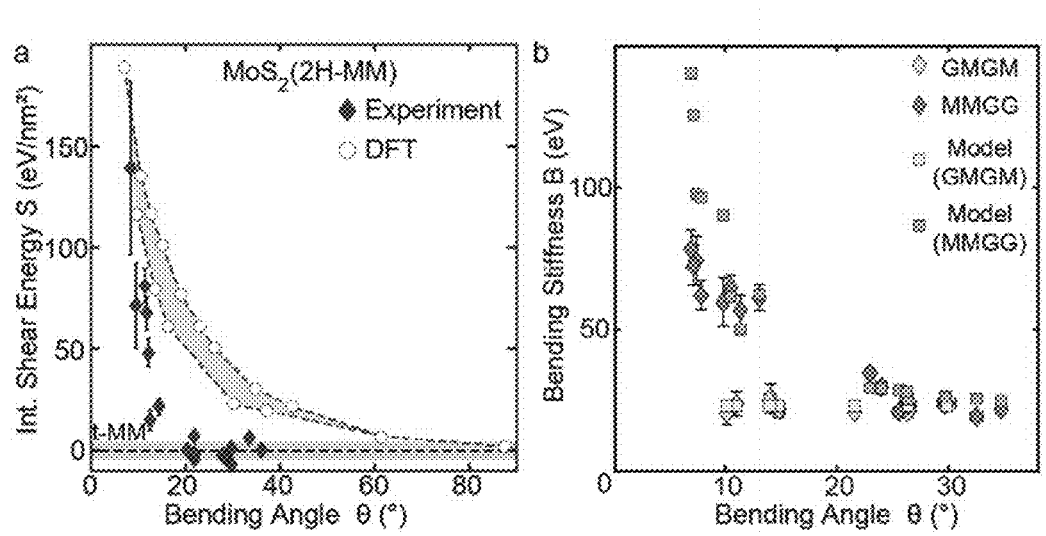
FIG. 24A plots interfacial shear energy S as a function of bending angle for 2H-MM, calculated from experiment (filled diamonds) and DFT (empty circles). The shading indicates the spread in DFT predictions between bending along the zigzag and armchair directions. The gray dashed line and associated shading indicate mean and spread in experimentally derived S of t-MM propagated from measurement error.
FIG. 24B plots bending stiffness of MMGG (dark gray data set) and GMGM (light gray data set). The diamonds indicate experimental values from STEM images, whereas the squares indicate predicted values from the model. The error bars represent one standard error propagated from measurement precision.

FIG. 24A compares the experimentally derived and computationally predicted values of S(θ) for aligned 2H-MM and misaligned t-MM. The curved shaded region indicates the difference in DFT predictions for bending along the zigzag and armchair directions; this spread exists because, for aligned multilayers, the bending stiffness is dependent on the bending direction with respect to the crystal lattice. From experiment, the $S_{2H-MM}$ and $S_{BS-GG}$ (for Bernal-stacked bilayer graphene) are observed to be up to 140 and 95 eV $nm^{-2}$, respectively; these large values indicate that the interfacial interactions S(θ) dominate at low bending angles. In contrast, we measured $S_{t-MM}$=-0.5±4.7 eV $nm^{-2}$ and $S_{GM}$=-0.2±1.4 eV $nm^{-2}$. These values are zero to within our measurement error, confirming that twisted and heterointerfaces are nearly frictionless and thus may not contribute to the bending stiffness.

FIGS. 24B and 2C show that the model can quantitatively predict the bending stiffness of arbitrarily complex 2D heterostructures, including those which are too large to simulate directly using first-principles calculations. FIG. 24B plots the bending stiffness versus bending angle for four-layer heterostructures GMGM and MMGG measured experimentally (diamonds) and predicted by the model (squares). For the prediction using Equation (2), $B_{ml}$ comes from DFT, while R, θ, and S are derived from experiment. Overall, strong agreement is obtained between experiment and the model for both structures. For GMGM (light gray), the model predicts a constant B=23.0 eV across all bending angles, as compared to 22.8±2.1 eV from experiment. For MMGG (dark gray), the model yields B that are accurate to within the experimental error for each structure; mismatch between the model predictions and experiment primarily arises from uncertainty in S(θ) because the bending direction is unknown and different between each sample.

For structures where each individual layer is separated by twisted or heterointerfaces, S approaches zero and the bending stiffness (Equation (2)) simplifies to:

$$B = \sum_i^N B_{ml,i} \quad (3)$$

FIG. 24C plots the experimentally measured bending stiffness of GM, t-MM, and GMGM—all structures with only misaligned interfaces—against the sum of their monolayer bending stiffness components $B_{ml}$ predicted from DFT. Also included are values for monolayer graphene (G) and monolayer MoS$_2$ (M) for reference. While there is a spread in the individual measurements of B (black diamonds), the mean experimental B for each structure (crosses) can be predicted to within 0.4 eV of the model prediction (black line). This behavior may be understood in the context of continuum mechanics laminated beam theory, where the bending stiffness of a stack of frictionless beams is equal to the sum of bending stiffness of each beam, leading to a bending stiffness that scales linearly with the number of layers and represents the theoretical lower limit of bending stiffness for a 2D multilayer.

In FIGS. 10 and 24D-24E, the bending model is used to establish design rules to control the bending stiffness of 2D heterostructures. First, because S approaches zero for misaligned interfaces, incorporating twisted and heterointerfaces may decrease B. This principle is illustrated in FIG. 10, where the model is applied to predict how the bending stiffness may vary for 8-layer MoS$_2$ as a function of the number of misaligned (e.g., twisted) interfaces. For this prediction, a symmetric S-shaped curve is assumed with a constant bending angle θ=10° ($S_{2H-MM}$(θ)=80 eV nm$^{-2}$) and radius of curvature R=10 nm at the neutral axis. In a fixed geometry, the bending stiffness decreases roughly linearly with the number of heterointerfaces. B is also weakly dependent on the location of the twisted interface (see inset, FIG. 10). For a fixed number of twisted interfaces, the B is highest when the twisted interfaces are closest to the center of the 2D multilayer. The symmetric position dependence is a result of the symmetric S-shaped curve used, so interface 1 is equivalent to interface N−1.

FIGS. 24D and 24E show that interfacial engineering becomes more important when the overall thickness and size of the 2D multilayers increase. FIG. 24D plots the bending stiffness as a function of thickness for aligned (2H-stacked) and misaligned (twisted) multilayer MoS$_2$ under the same fixed geometry as in FIG. 10. FIG. 24E plots the bending stiffness of aligned and misaligned multilayer MoS$_2$ stacks of different thicknesses as a function of arc length L, which represents the length of the sample that is bent to a constant curvature. In both cases, the relative contribution from the interface compared with the constituent monolayers increases drastically as a function of thickness or bend size. In the misaligned multilayers, the bending stiffness is a linear sum of the stiffness of each layer, and it is independent of the size of the bend. The dependence of B with N and L for the aligned structure is more complex. For nonzero S, the interfacial contribution to the bending stiffness increases quadratically with the system size and linearly with the number of interfaces; these scaling laws are consistent with the predictions of Timoshenko beam theory for anisotropic materials under large deformations. Importantly, the different scaling properties between aligned and misaligned structures make it so that their stiffnesses diverge rapidly as the size and thickness increase. In the limit of device-scale 2D structures, which typically contain a dozen or more layers and large bends tens or hundreds of nanometers across, the model indicates that misaligned structures can be made orders of magnitude more deformable than aligned 2D materials or conventional thin films.

These observations have important implications for the design of 2D heterostructure devices. First, these results demonstrate that the bending stiffness can be tuned over a large range by manipulating the number—and to a lesser extent, the location—of misaligned interfaces in 2D stacks. Second, interfacial engineering makes it possible to obtain low B structures, even in devices with a large number of layers. Whereas the bending stiffness increases rapidly with thickness for conventional thin films, FIG. 10 shows that incorporating misaligned interfaces makes it possible to maintain extremely low B, even in 2D multilayers. The impact of interfacial engineering is so significant that, for example, FIG. 4E shows that it is possible to fabricate twisted 30-layer MoS$_2$ that is even more deformable than aligned trilayer MoS$_2$. Importantly, in structures where each layer is separated by twisted or heterointerfaces, the bending stiffness reaches a minimum and becomes independent of bending angle and system size for nanoscale to microscale curvatures. This theoretical lower limit, where the B is equal to the sum of its constituent $B_{ml}$, is particularly powerful because 2D monolayers have exceptionally low intrinsic bending stiffness—in the range of 1.4-20 eV, or 60-800 kT at room temperature, on the same order as lipid bilayers.

CONCLUSION

Together, these results demonstrate that interfacial engineering may provide a profound opportunity to manipulate and design deformable 2D electronics. First, this work shows that 2D heterostructure devices, a diverse class of 2D electronics, are intrinsically well-suited to deformable electronics. Second, the work provides a roadmap to design 2D multilayers to maximize their out-of-plane deformability by incorporating twisted or heterointerfaces. Because the thickest component of 2D nanoelectronics like transistors is often a h-BN dielectric, such modifications could be made to tune the bending stiffness of 2D devices with minimal impact on their electronic properties. For example, one could design a highly deformable transistor in which each layer—including the h-BN dielectric, $MoS_2$ active layer, and graphene gate and contacts—is separated by a twisted or heterointerface. Even in nominally flat 2D electronics, fabrication methods for high-electrical-mobility devices often include local gates or contacts, which produce bent 2D layers. In this context, this work can also inform the design of more complex 3D architectures for 2D electronics, including conformal 2D contacts or highly curved 3D circuits. Finally, these design principles may be important for an emerging generation of reconfigurable 2D devices, including folded, curved, and crumpled nanostructures, where they may enable flexible, stretchable, or conformal circuitry that are orders of magnitude more deformable than conventional electronics.

Experimental Section

Fabrication of van der Waals Heterostructures: To fabricate graphene-$MoS_2$ heterostructures, established hot pick-up techniques were utilized to produce clean van der Waals interfaces between graphene and $MoS_2$ heterostructures. First, graphene and $MoS_2$ were exfoliated onto a SiO2 (285 nm)/Si substrate with the scotch tape method. To pick up the monolayer flakes, a transparent sacrificial transfer substrate was fabricated. A polydimethylsiloxane (PDMS) droplet was deposited on a glass slide. After curing, the PDMS droplet was covered with a polycarbonate (PC) film and annealed for 10 min to achieve good conformation. The pickup and transfer procedures were accomplished by inserting the target substrates and sacrificial transfer substrate into an aligned transfer station in a nitrogen glovebox. The monolayer or bilayer flakes were picked up by contacting the PC-coated PDMS lens on the designated flake, and increasing the temperature to 90° C. This process was then repeated to pick up other 2D flakes to form a multilayer stack on the PC-coated PDMS lens. Once the pick up process was done, the multilayer stack was transferred onto terraced hexagonal boron nitride (h-BN), which was exfoliated on the $SiO_2$ (285 nm)/Si substrate. Once the multilayer stack was fully contacted with terraced h-BN, the substrate temperature was increased to 180° C. to melt PC films to release from the PDMS. After the final transfer, the sample was annealed under high vacuum at 350° C. for 14 h.

To fabricate twisted bilayer $MoS_2$ with measurable interlayer twist angle, first monolayer single crystals of $MoS_2$ were synthesized via solid precursor chemical vapor deposition. Monolayer $MoS_2$ triangles were grown by placing molybdenum trioxide and sulfur solid precursors on top of a SiO2 (285 nm)/Si substrate and heated to 675° C. for 5 min in an argon environment. The monolayer $MoS_2$ on the $SiO_2$ (285 nm)/Si substrate was spin-coated with 5% PC dissolved in chloroform and was attached to the PDMS stamp. The entire structure was then dipped in a KOH solution to detach the $SiO_2$/Si substrate, leaving the monolayer on the stamp. Next, the monolayer $MoS_2$ flakes on the PC films were transferred onto another $MoS_2$ monolayer flake using aligned transfer techniques described above. Although these examples refer specifically to $MoS_2$ and graphene, the methods are generally applicable to fabricating stacks of 2D monolayers comprising any 2D material(s).

TEM Sample Preparation: A protective layer of amorphous carbon that was 5-30 nm thick, was thermally evaporated on top of the 2D heterostructures. Then, cross-sectional STEM samples were fabricated using standard focused ion beam (FIB) lift-out procedures in a FEI Helios 600i Dual Beam FIB-SEM. Final milling was done at 2 kV to reduce sample damage, using a cryo-can to minimize redeposition.

Aberration-corrected STEM Imaging: The cross-sectional samples were imaged in a Thermo Fisher Scientific Themis Z aberration-corrected STEM. The STEM was operated at 80 kV, below the knock-on damage thresholds of graphene and h-BN, and close to the knock-on damage threshold for $MoS_2$. A convergence angle of 25.2 mrad was used.

Density Functional Theory Calculations: The Vienna Ab initio Simulation Package (VASP) with the projector augmented wave pseudopotentials was used to conduct density functional theory simulations. A van der Waals density functional, vdW-DF2, was used to incorporate van der Waals adhesion between different 2D materials. An energy cutoff of the plane wave basis is 350 eV, with a total energy conversion criteria of 10-4 eV. 30 Å of vacuum was included to avoid self-interaction of the 2D material membranes in the periodic boundary conditions. The sliding barrier of the bilayers was calculated from the difference in the total energy of each configuration (aligned, twisted, heterostructure) when one layer slides with respect to the other layer compared with the lowest energy position for each configuration. The displacement of each step was 0.1 Å. In order to calculate the bending energy through simulation, bending was introduced in the 2D heterostructure by reducing the size of supercell in a given direction along the basal plane. To induce out of plane buckling, a small geometric perturbation was introduced to the initial configuration. To find the ground state geometry, the geometry were allowed to relax until the forces on each atom were below 0.04 eV Å$^{-1}$. The bending energy was then estimated by subtracting the energy of the flat, uncompressed structure.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:
1. A deformable electronic device comprising:
   a multilayer device structure comprising:
      functional layers on a flexible polymeric substrate, each of the functional layers comprising one or more 2D monolayers, the functional layers including electronically active layers and other layers having a dielectric, insulating and/or protective function; and
      a misaligned interface comprising a twist angle between adjacent functional layers,
      wherein the other layers include first and second encapsulation layers and a dielectric layer, and
      wherein at least one of the other layers comprises a stack of 2D monolayers, and wherein each stack of 2D monolayers includes at least one misaligned interface, the at least one misaligned interface comprising a twist angle and/or lattice mismatch between adjacent 2D monolayers.
2. The deformable electronic device of claim 1, wherein the twist angle lies in a range from about 0.1° to about 180°.

3. The deformable electronic device of claim 1, wherein the multilayer device structure includes a plurality of the misaligned interfaces.

4. The deformable electronic device of claim 1, wherein the one or more 2D monolayers of each of the functional layers comprise one or more 2D materials selected from the group consisting of: graphene, silicene, germanene, phosphorene, a transition metal dichalcogenide, $MoS_2$, $WS_2$, $MoSe_2$, $WSe_2$, $MoTe_2$, a semiconducting metal dichalcogenide, $SnS_2$, $SnSe_2$, h-BN, BeO, a transition metal oxide, $MnO_2$, ZnO, a transition metal carbide, a transition metal carbonitride, $Bi_2Se_3$, and $Sb_2Te_3$.

5. The deformable electronic device of claim 1, wherein each stack of 2D monolayers includes at least five misaligned interfaces within the stack, each of the at least five misaligned interfaces comprising a twist angle and/or lattice mismatch between adjacent 2D monolayers.

6. A deformable electronic device comprising:
a multilayer device structure comprising functional layers on a flexible polymeric substrate, the functional layers including electronically active layers and other layers having a dielectric, insulating and/or protective function, at least one of the other layers comprising a stack of 2D monolayers,
wherein each stack of 2D monolayers includes at least five misaligned interfaces within the stack, each of the at least five misaligned interfaces comprising a twist angle and/or lattice mismatch between adjacent 2D monolayers.

7. The deformable electronic device of claim 6, wherein a proportion or number of misaligned interfaces within each stack is controlled to obtain a predetermined bending stiffness.

8. The deformable electronic device of claim 7, wherein the proportion is at least about 0.3.

9. The deformable electronic device of claim 8, wherein the proportion is between 0.5 and 1.0.

10. The deformable electronic device of claim 6, wherein each of the other layers has a thickness in a range from about 3 nm to about 100 nm.

11. The deformable electronic device of claim 6, wherein at least one of the other layers further comprises a 3D film, the stack of 2D monolayers being positioned adjacent to or within the 3D film.

12. The deformable electronic device of claim 6, wherein the electronically active layers include a gate electrode, a channel, a source electrode, and/or a drain electrode, and
wherein the other layers include first and second encapsulation layers and a dielectric layer, the deformable electronic device comprising a field effect transistor.

13. The deformable electronic device of claim 6, wherein the stack of 2D monolayers comprises one or more 2D materials selected from the group consisting of: graphene, silicene, germanene, phosphorene, a transition metal dichalcogenide, $MoS_2$, $WS_2$, $MoSe_2$, $WSe_2$, $MoTe_2$, a semiconducting metal dichalcogenide, $SnS_2$, $SnSe_2$, h-BN, BeO, a transition metal oxide, $MnO_2$, ZnO, a transition metal carbide, a transition metal carbonitride, $Bi_2Se_3$, and $Sb_2Te_3$.

14. The deformable electronic device of claim 6, wherein each of the functional layers comprises one or more 2D monolayers, and
further comprising a misaligned interface comprising a twist angle between adjacent functional layers.

15. The deformable electronic device of claim 6, wherein the multilayer device structure is crumpled.

\* \* \* \* \*